(12) United States Patent
Kurosawa et al.

(10) Patent No.: US 8,139,396 B2
(45) Date of Patent: Mar. 20, 2012

(54) RESISTANCE CHANGE MEMORY AND CONTROL METHOD THEREOF

(75) Inventors: Tomonori Kurosawa, Yokohama (JP); Hiroshi Maejima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 24 days.

(21) Appl. No.: 12/880,642

(22) Filed: Sep. 13, 2010

(65) Prior Publication Data
US 2011/0069533 A1      Mar. 24, 2011

(30) Foreign Application Priority Data
Sep. 18, 2009   (JP) .................................. 2009-217893

(51) Int. Cl.
*G11C 11/00*       (2006.01)
*G11C 7/00*        (2006.01)
(52) U.S. Cl. ................................. 365/148; 365/189.011
(58) Field of Classification Search .................. 365/148
See application file for complete search history.

(56) References Cited

U.S. PATENT DOCUMENTS

| | | | |
|---|---|---|---|
| 7,656,221 B2 | 2/2010 | Maejima | |
| 2003/0072194 A1* | 4/2003 | Kamei et al. .................. | 365/200 |
| 2004/0190324 A1* | 9/2004 | Yamamura .................... | 365/145 |
| 2010/0034012 A1* | 2/2010 | Matsuo ......................... | 365/148 |
| 2010/0046275 A1* | 2/2010 | Hosono et al. ................ | 365/148 |
| 2010/0097127 A1 | 4/2010 | Maejima | |
| 2010/0172171 A1* | 7/2010 | Azuma et al. ................. | 365/148 |
| 2011/0069524 A1* | 3/2011 | Toba et al. ..................... | 365/63 |

OTHER PUBLICATIONS

Yoshihiro Sato, et al., "Sub-100-μA Reset Current of Nickel Oxide Resistive Memory Through Control of Filamentary Conductance by Current Limit of MOSFET", IEEE Transactions on Electron Devices, vol. 55, No. 5, May 2008, pp. 1185-1191.

* cited by examiner

*Primary Examiner* — Hoai V Ho
*Assistant Examiner* — Min Huang
(74) *Attorney, Agent, or Firm* — Oblon, Spivak, McClelland, Maier & Neustadt, L.L.P.

(57) ABSTRACT

According to one embodiment, a resistance change memory includes a memory cell array in which a plurality of blocks are provided, resistance change storage elements which are provided in blocks and which store data in accordance with a change in resistance state, first and second wirings in the blocks, each of the first and second wirings being connected to each of resistance change storage elements, and a control circuit which controls the state of a selected block targeted for operation and the state of unselected blocks except the selected block among the blocks. The control circuit respectively applies first and second unselect potentials to the first and second wirings in at least one of the unselected blocks during a period in which the selected block is in operation.

16 Claims, 17 Drawing Sheets

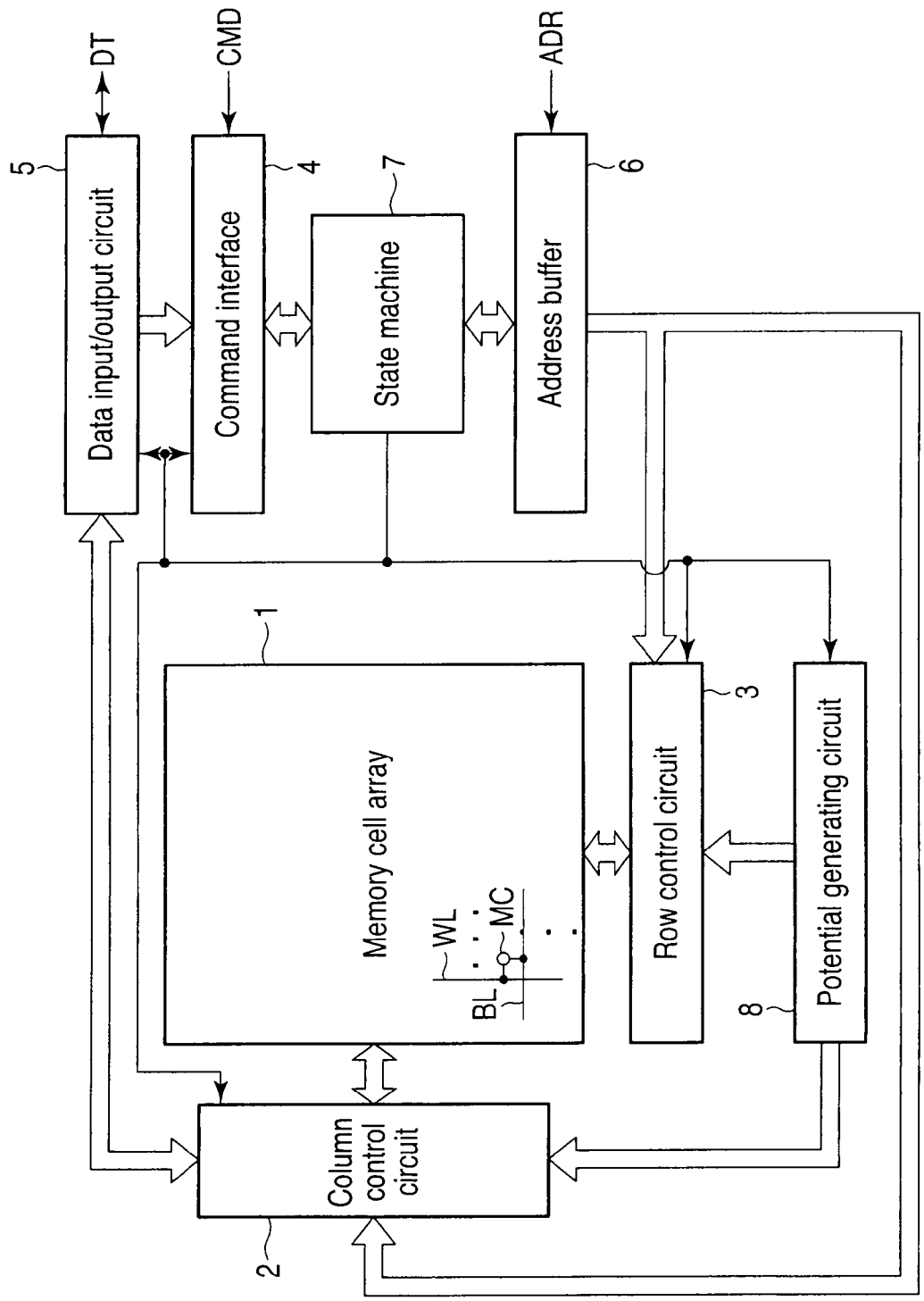
F I G. 1

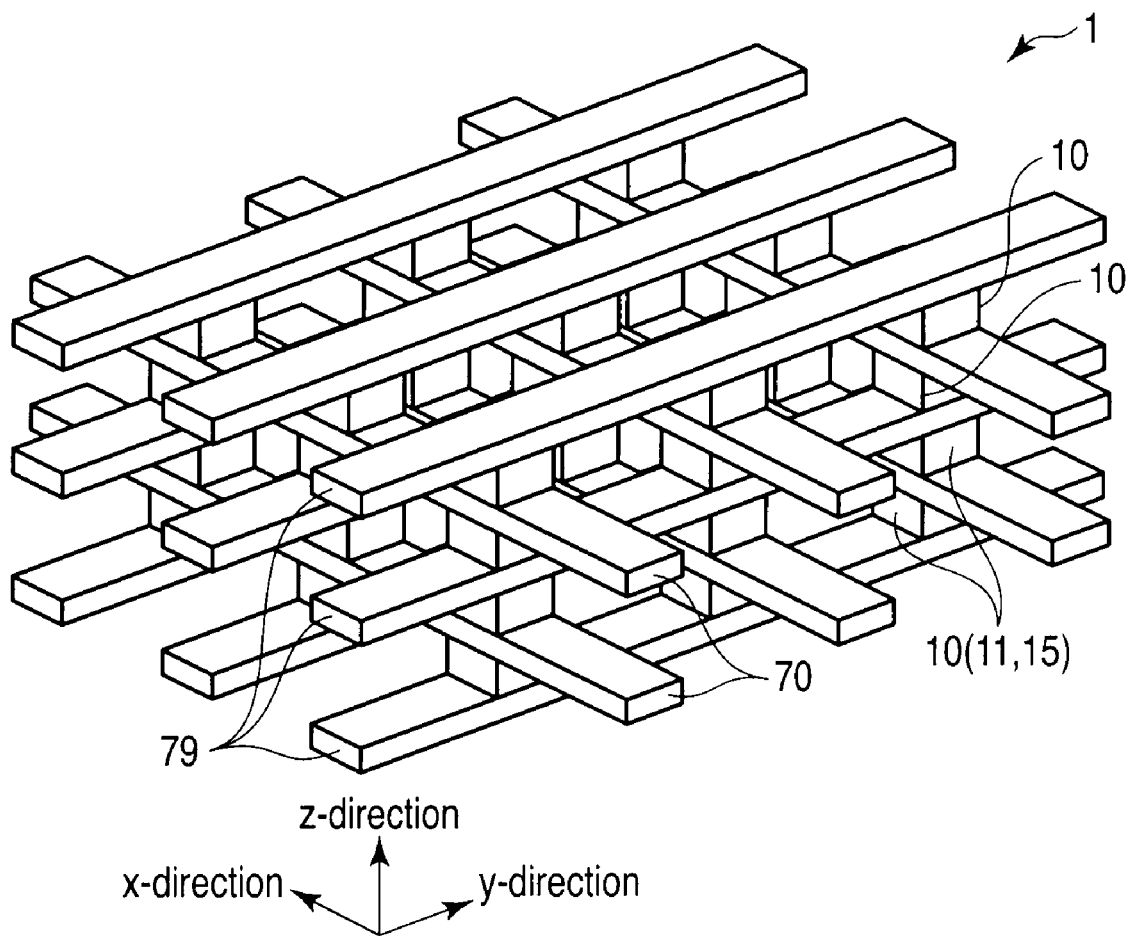
F I G. 4

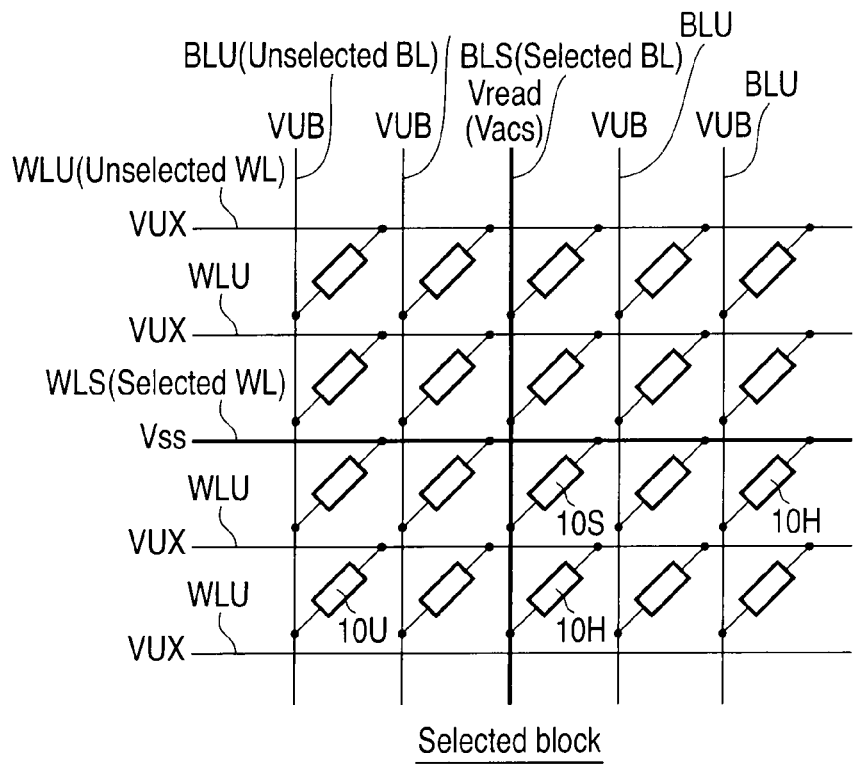
F I G. 7A
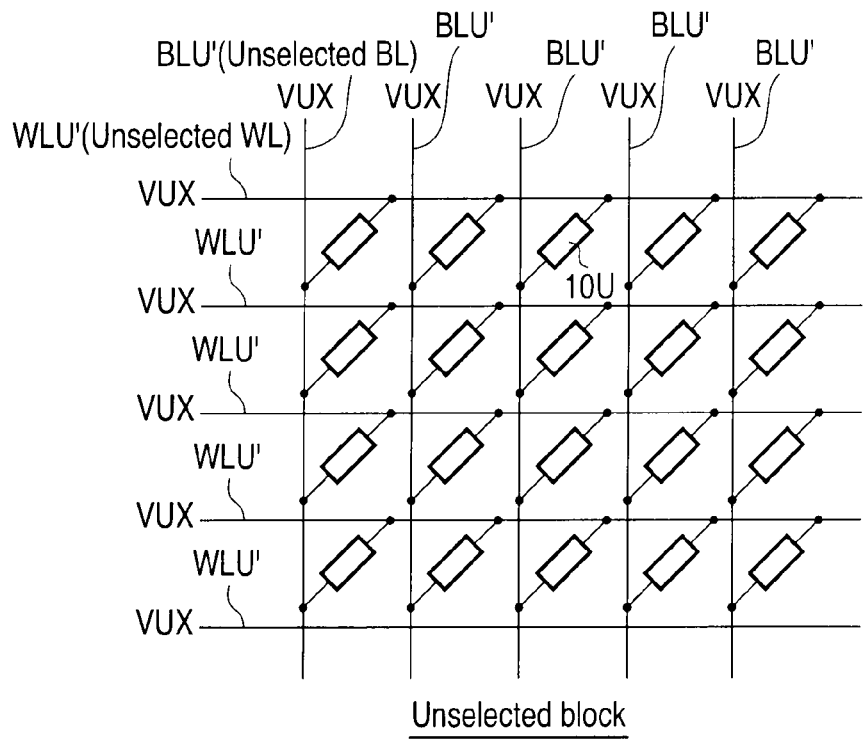
F I G. 7B

FIG. 10C Sleep mode

FIG. 10B Stand-by mode

FIG. 10A Access mode

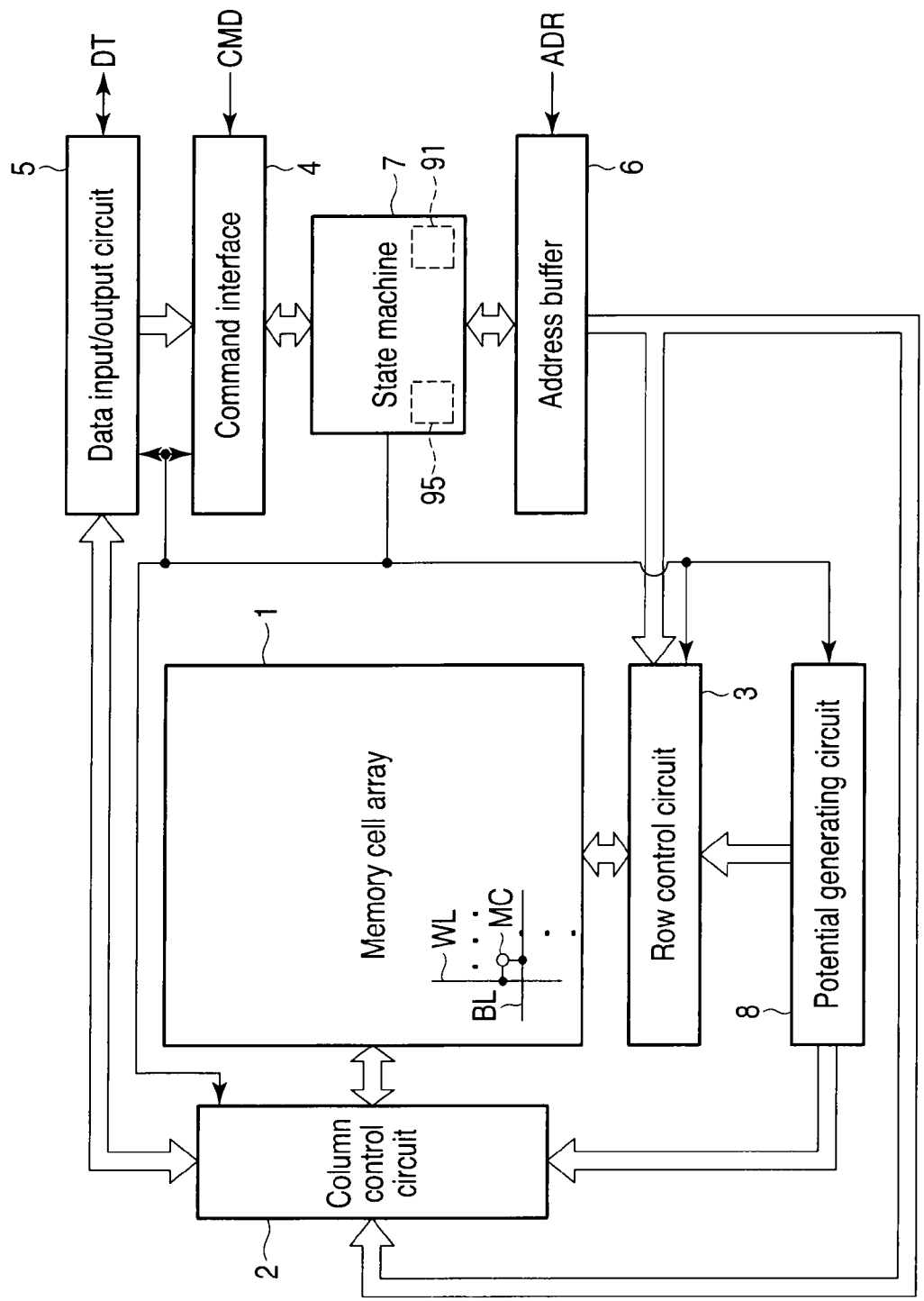
F I G. 13

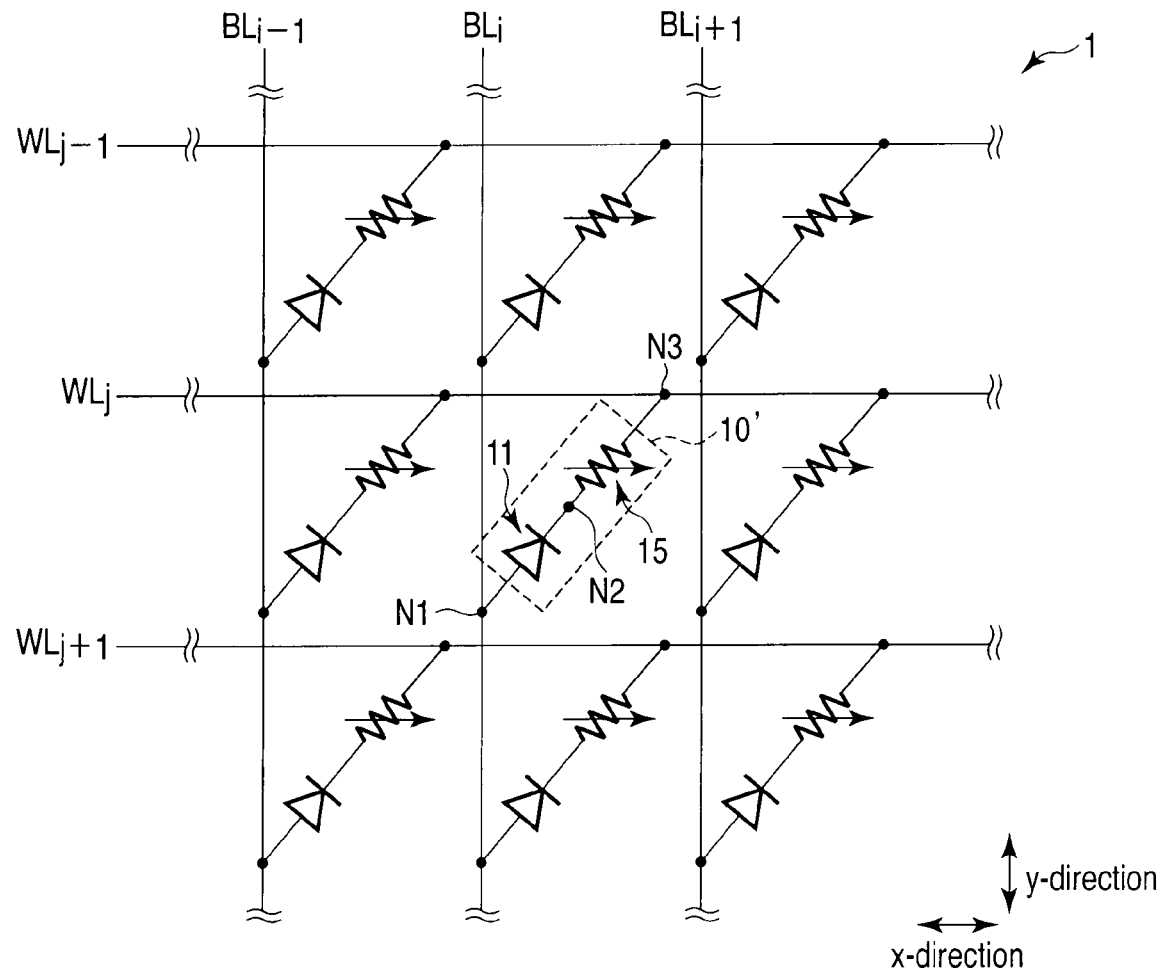
F I G. 15

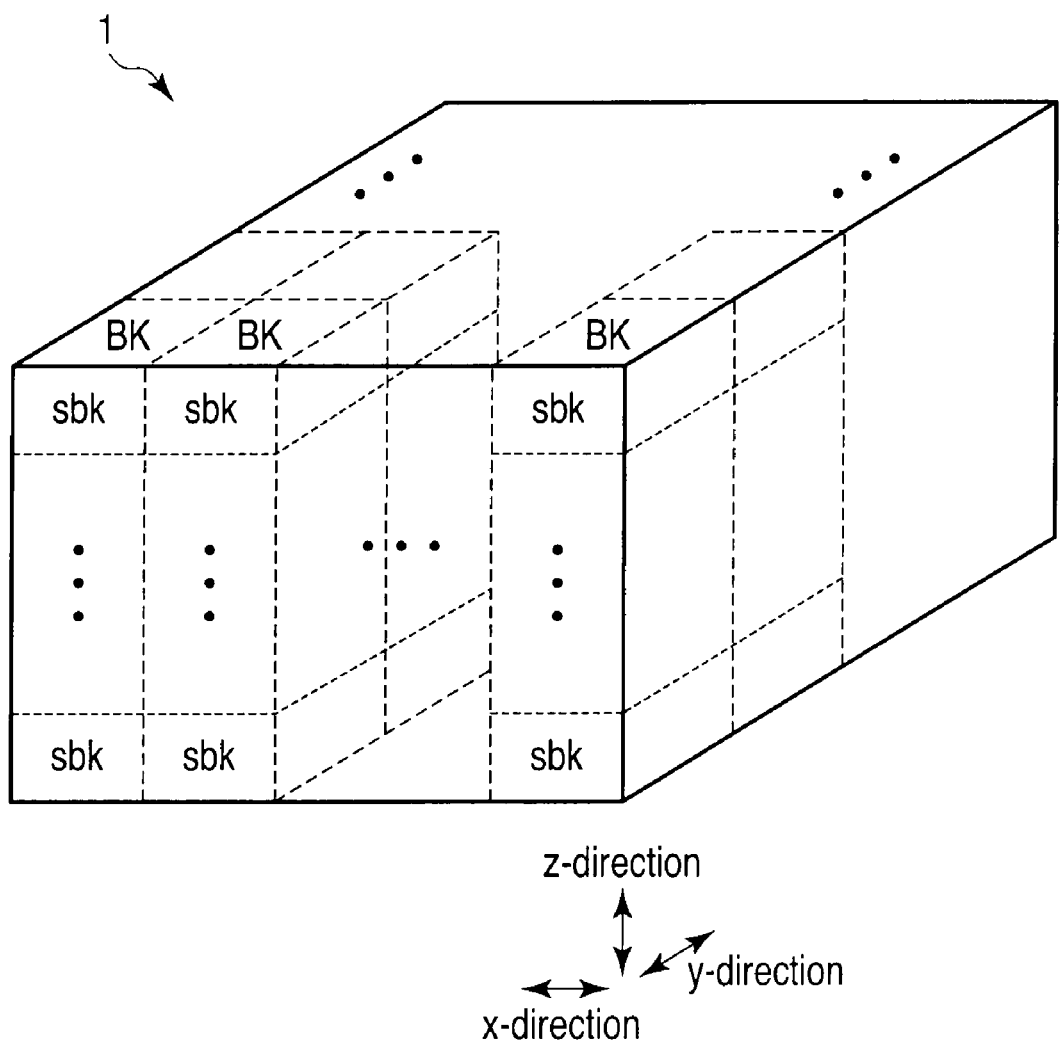
F I G. 16

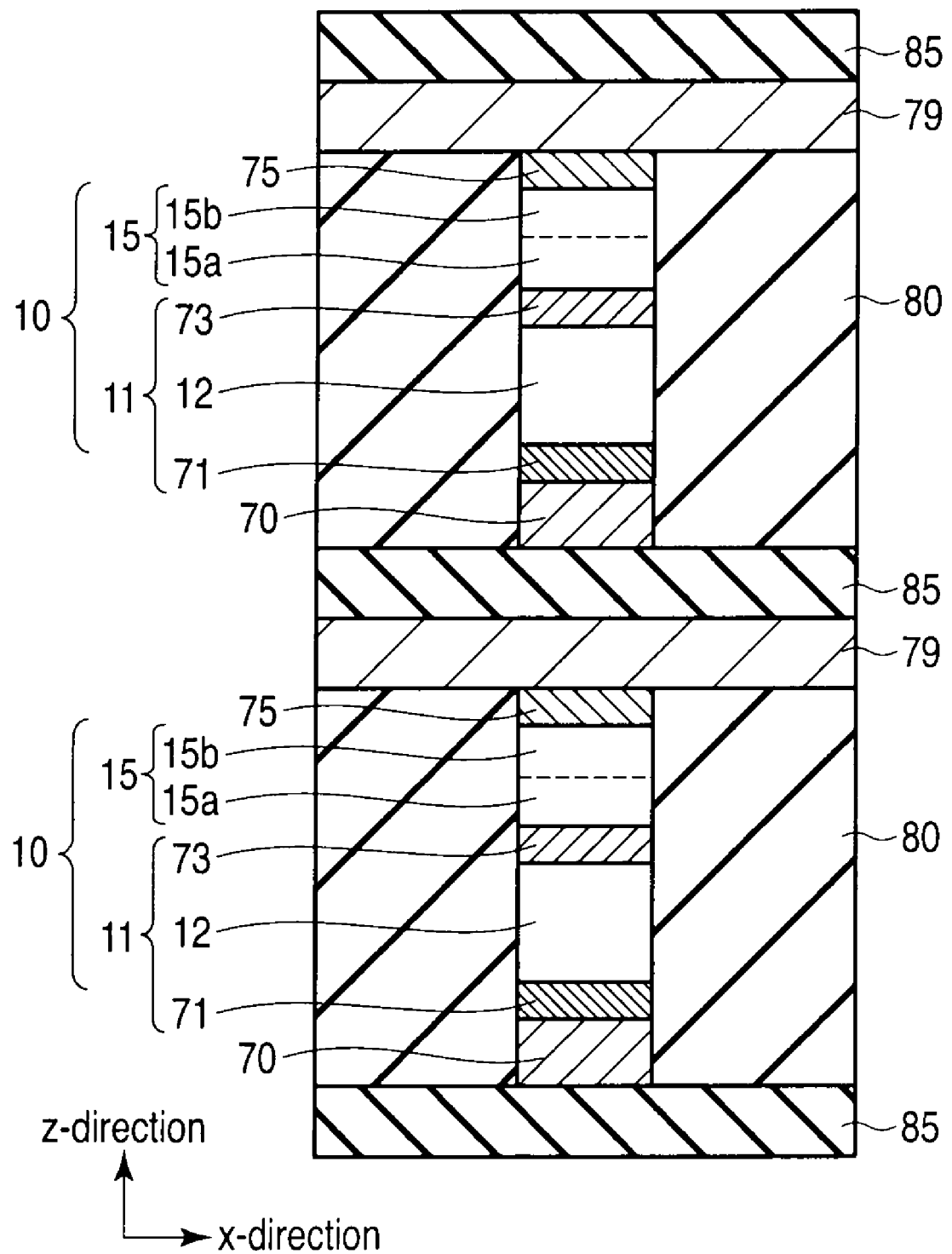
F I G. 17

RESISTANCE CHANGE MEMORY AND CONTROL METHOD THEREOF

CROSS-REFERENCE TO RELATED APPLICATIONS

This application is based upon and claims the benefit of priority from Japanese Patent Application No. 2009-217893, filed Sep. 18, 2009; the entire contents of which are incorporated herein by reference.

FIELD

Embodiments described herein relate generally to a resistance change memory and a control method thereof.

BACKGROUND

Recently, as next-generation nonvolatile semiconductor memories, much attention has been paid to resistance change memories such as a resistive RAM (ReRAM) using a variable resistive element as a memory element, and a phase change RAM (PCRAM) using a phase change element as a memory element.

These resistance change memories are characterized in that the shrinking of each element is relatively easy and a higher memory capacity can be realized by three-dimensional integration using a cross-point memory cell array. In addition, the resistance change memories are capable of achieving the same high-speed operation as in a DRAM.

If the resistance change memory having such characteristics is put to practical use, a flash memory serving as a file memory or a DRAM serving as a work memory, for example, can be replaced with the resistance change memory. Accordingly, various configurations and operations of the resistance change memory have been suggested (e.g., see Jpn. Pat. Appln. KOKAI Publication No. 2009-99200). In order to put the resistance change memory to practical use, characteristic improvements such as high-speed operation, high reliability and low power consumption are required for the resistance change memory.

BRIEF DESCRIPTION OF THE DRAWINGS

FIG. 1 is a block diagram showing a resistance change memory according to a first embodiment;

FIG. 4 is a bird's eye view showing a structure example of the memory cell array;

FIG. 7A is diagram for illustrating the operation of the resistance change memory according to the first embodiment;

FIG. 7B is diagram for illustrating the operation of the resistance change memory according to the first embodiment;

FIG. 13 is a block diagram showing a resistance change memory according to a third embodiment;

FIG. 15 is a diagram showing a modification of the memory cell array;

FIG. 16 is a diagram showing a modification of the memory cell array;

FIG. 17 is a diagram showing a modification of the memory cell array; and

DETAILED DESCRIPTION

Figure 2A:
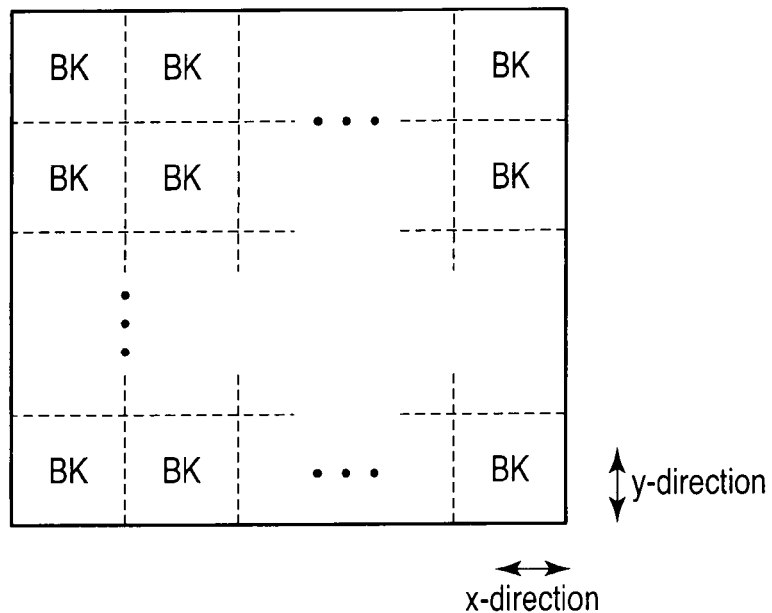
FIG. 2A is schematic diagram showing a configuration example of a memory cell array.

Hereinafter, embodiments will be described in detail with reference to the drawings. In the following explanation, elements having the same function and configuration are provided with the same signs and are repeatedly described when necessary.

In general, according to one embodiment, a resistance change memory includes a memory cell array in which a plurality of blocks are provided; a plurality of resistance change storage elements which are provided in the plurality of blocks and which store data in accordance with a change in resistance state; a plurality of first wirings along a first direction in the plurality of blocks; each of the first wirings being connected to each of the plurality of resistance change storage elements; a plurality of second wirings along a second direction in the plurality of blocks, each of the second wirings being connected to each of the plurality of resistance change storage elements; and a control circuit which controls the state of a selected block targeted for operation and the state of a plurality of unselected blocks except the selected block among the plurality of blocks. The control circuit respectively applies first and second unselect potentials to the first and second wirings in at least one of the unselected blocks during a period in which the selected block is in operation.

EMBODIMENT

(A) First Embodiment

The overall configuration of a resistance change memory according to the first embodiment is described with reference to FIGS. 1 to 8. The resistance change memory according to the embodiment is, for example, a resistive RAM (ReRAM) or a phase change RAM (PCRAM).

(1) Overall Configuration

The overall configuration of the resistance change memory according to the first embodiment is described with reference to FIG. 1.

In FIG. 1, there is shown a configuration example of a chip of the resistance change memory according to the present embodiment.

A memory cell array 1 has a plurality of resistance change storage elements (memory cells MC). In the memory cell array 1, a plurality of bit lines BL and a plurality of word lines WL are provided. The resistance change storage element MC is connected to the bit line BL and the word line WL. The resistance change storage element MC is driven under the control of the word line WL and the bit line BL. The connection of the resistance change storage element MC to the bit line BL and the word line WL varies depending on the internal configuration of the memory cell array 1. The internal configuration of the memory cell array 1 will be described later.

A column control circuit 2 controls the operation of the bit line BL, that is, the application of a potential or supply of current to the bit line BL. The column control circuit 2 includes a sense amplifier, a latch circuit or a buffer. The column control circuit 2 selects a bit line indicated by an externally input column address, and activates this bit line.

A row control circuit 3 controls the operation of the word line WL, that is, the application of a potential or supply of current to the word line. The row control circuit 3 includes a transfer transistor or a switch element. The row control circuit 3 selects a word line indicated by an externally input row address, and activates this word line.

The bit line BL is controlled by the column control circuit 2, and the word line WL is controlled by the row control circuit 3 so that data is written, read or erased in the resistance change storage element MC connected to the word line WL and the bit line BL.

On receipt of a command signal CMD from an external device such as a host device, a command interface 4 transfers the command signal CMD to a state machine 7. The command signal CMD indicates, for example, a write command, a read command or an erase command.

A data input/output buffer 5 temporarily retains input or output data DT. The data input/output buffer 5 transfers the externally input write data DT to the memory cell array 1 via, for example, the column control circuit 2. The data input/output buffer 5 also externally transfers the data DT read from the memory cell array.

For example, an address signal ADR is externally input to an address buffer 6. The address signal ADR indicates, for example, an address (selected address) of a selected resistance change storage elements (selected cell). The address buffer 6 transfers, to the column control circuit 2, an address (column address) of the bit line included in the address signal ADR. The address buffer 6 also transfers, to the row control circuit 3, an address (row address) of the word line included in the address signal ADR.

The state machine 7 manages and controls the operation of the whole chip. On receipt of the command signal CMD transferred from the command interface 4, the state machine 7 controls the operation of other circuits 2 to 9 in accordance with the command signal CMD. The state machine 7 also transfers, for example, status information to the host device outside the chip. On the basis of the status information, the host device judges whether the operation result is appropriate.

A potential generating circuit 8 is provided in the chip. The potential generating circuit 8 is controlled by the state machine 7. For example, the potential generating circuit 8 generates a potential to be applied to the bit line BL and the word line WL. For example, a pulse generator is used as the potential generating circuit 8 in the case of a memory which switches the resistance state of the resistance change storage element in accordance with a voltage (pulse voltage) having a predetermined pulse shape. When data is written to a selected cell or when data is read from a selected cell, the potential generating circuit 8 applies the generated potential to a selected bit line or selected word line via the column control circuit 2 or the row control circuit 3. Further, the potential generating circuit 8 generates a potential to be applied to the unselected bit lines and the unselected word lines.

(2) Memory Cell Array

A configuration example of the memory cell array 1 in the resistance change memory shown in FIG. 1 is described with reference to FIGS. 2A to 5.

Figure 2B:
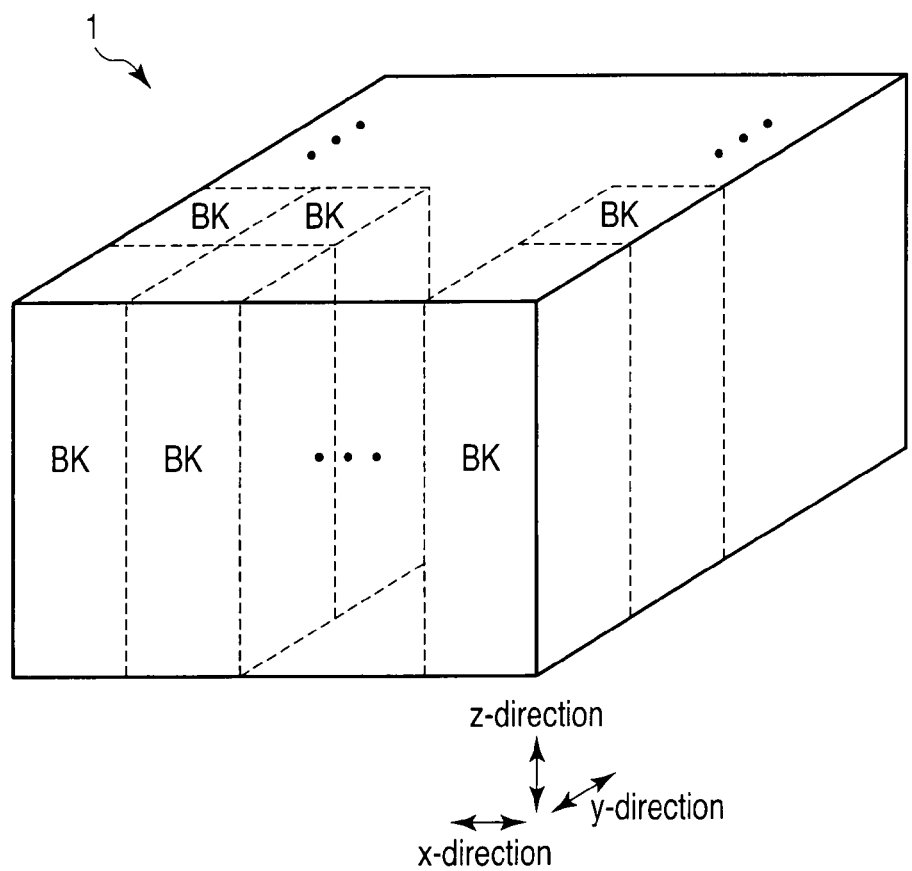
FIG. 2B is schematic diagram showing a configuration example of a memory cell array.

FIGS. 2A and 2B show an example of the configuration of the memory cell array 1.

As shown in FIGS. 2A and 2B, a plurality of control units BK, for example, are set in the memory cell array 1. In the present embodiment, the control units BK are referred to as blocks BK. An address of the block BK is indicated by, for example, several upper bits of the address signal ADR. The blocks BK may be, for example, logically divided logical regions (logical blocks) or physically divided physical regions (physical blocks). As shown in FIG. 2A, the blocks BK are arranged along the x- and y-directions of the memory cell array 1. For example, as shown in FIG. 2B, the control unit BK is not divided in the z-direction. One column control circuit 2 and one row control circuit 3 may be provided for one block BK. One column control circuit 2 or one row control circuit 3 may be shared by a plurality of blocks BK.

Figure 3:
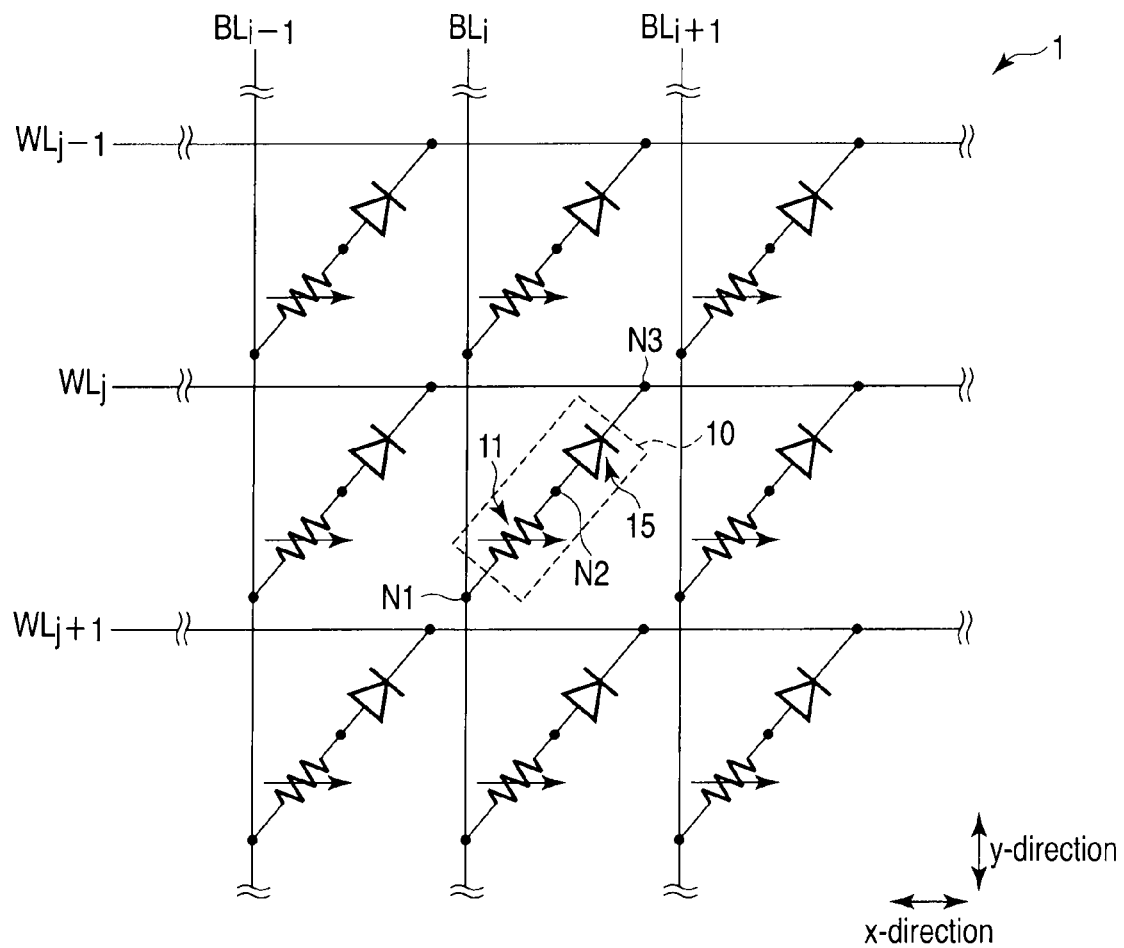
FIG. 3 is an equivalent circuit diagram showing the configuration example of the memory cell array.

FIG. 3 shows an example of an equivalent circuit of the memory cell array 1.

A plurality of word lines (first wirings) $W_{j-1}$, $WL_j$, $WL_{j+1}$ extending in the x-direction (first direction) are provided in the memory cell array 1. Word lines $WL_{j-1}$, $WL_j$, $WL_{j+1}$ are arranged in the memory cell array adjacently to one another in the y-direction.

A plurality of bit lines (second wirings) $BL_{i-1}$, $BL_i$, $BL_{i+1}$ extending in the y-direction (second direction) intersecting with the x-direction are also provided in the memory cell array 1. Bit lines $BL_{i-1}$, $BL_i$, $BL_{i+1}$ are arranged in the memory cell array adjacently to one another in the x-direction.

The memory cell array 1 shown in FIG. 3 has a cross-point configuration. In the cross-point memory cell array 1 shown in FIG. 3, bit lines $BL_{i-1}$, $BL_i$, $BL_{i+1}$ and word lines $WL_{j-1}$, $WL_j$, $WL_{j+1}$ intersect with one another. A resistance change storage element 11 is provided at the intersection of bit lines $BL_{i-1}$, $BL_i$, $BL_{i+1}$ and word lines $WL_{j-1}$, $WL_j$, $WL_{j+1}$.

The resistance change storage element 11 uses the change of resistance (resistance state) to store, in a nonvolatile manner, data corresponding to the resistance. The resistance change storage element 11 is, for example, a two-terminal element having one end and the other. The resistance change storage element 11 used for a ReRAM has two operation modes. One of the operation modes is a bipolar operation mode in which a switch can be made between a high-resistance state and a low-resistance state by changing the polarity of an applied voltage. The other operation mode is a unipolar operation mode in which a switch is made between the high-resistance state and the low-resistance state by the control of a voltage (current) and the application time (pulse width) of a voltage (current).

The resistance change storage element 11 is connected in series to a non-ohmic element (e.g., diode) 15 between bit line $BL_i$ and word line $WL_j$. In the cross-point memory cell array 1, one resistance change storage element 11 functions as one memory cell. The non-ohmic element 15 is provided to suppress crosstalk over the unselected cells during the operation of the memory. Hereinafter, a configuration constituted of the resistance change storage element 11 and the non-ohmic element 15 that are connected in series will be referred to as a series circuit 10 or cell unit 10.

One example of the connection of the resistance change storage element 11 and the non-ohmic element 15 to bit lines $BL_{i-1}$, $BL_i$, $BL_{i+1}$ and word lines $WL_j$, $WL_{j+1}$ shown in FIG. 3 is as follows. In the case described in connection with the present embodiment, the diode is used for the non-ohmic element 15.

As shown in FIG. 3, one end of the resistance change storage element 11 is connected to, for example, bit line $BL_i$, and this connection point is a connection node N1. The other end of the resistance change storage element 11 is connected to, for example, the anode of the diode 15, and this connection point is a connection node N2. The cathode of the diode 15 is connected to, for example, word line $WL_j$, and this connection point is a connection node N3. In the connection shown in FIG. 3, when the potential applied to bit line $BL_i$ is higher than the potential applied to word line $WL_j$, a voltage (potential difference) in a forward bias direction is applied to the diode 15. When the potential applied to bit line $BL_i$ is lower than the potential applied to word line $WL_j$, a voltage in a reverse bias direction is applied to the diode 15.

The diode 15 has an asymmetric voltage-current characteristic. In a steady operation of the diode 15, a current running from the anode side to the cathode side is high, and a current running from the cathode side to the anode side is significantly low. Therefore, when the diode is used as the non-ohmic element 15, an operation (writing/reading) performed on the resistance change storage element 11 is the unipolar operation.

Figure 5:
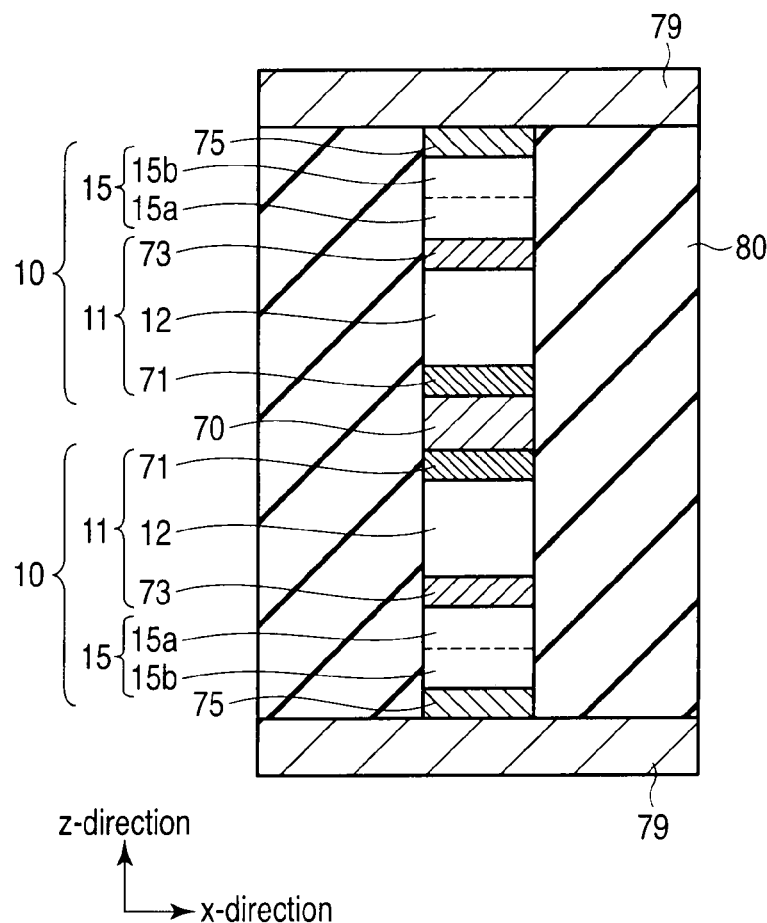
FIG. 5 is a sectional view showing the structure example of the memory cell array.

FIGS. 4 and 5 show an example of the structure of the memory cell array 1 in the resistance change memory according to the present embodiment.

FIG. 4 is a bird's eye view showing the structure of the memory cell array 1. FIG. 4 shows the structure of the cross-point memory cell array 1.

As shown in FIG. 4, the cross-point memory cell array 1 has, for example, a structure in which wirings 70, 79 serving as the bit lines and word lines are stacked in a direction (z-direction) perpendicular to an x-y plane. The cell unit 10 including the resistance change storage element 11 and the non-ohmic storage element 15 is stacked on the wirings (interconnects) 70, 79. In the example shown in FIG. 4, one cell unit 10 is vertically held between the two wirings 70, 79 and is provided on the wirings 70, 79. In FIG. 4, the wirings (word lines and bit lines) 70, 79 and the resistance change storage elements 11 are stacked alternately in the z-direction.

As shown in FIG. 4, the memory cell array has a three-dimensional structure, so that a manufacturing cost per bit is reduced.

For example, peripheral circuits for controlling the operation of the memory cell array 1, such as the column control circuit 2 and the row control circuit 3 shown in FIG. 1, are formed on a semiconductor substrate under the memory cell array 1 via an interlayer insulating film. In this case, the chip area of the resistance change memory according to the present embodiment is substantially equal to the area of the memory cell array, which contributes to a reduction in the chip area.

FIG. 5 shows a sectional structure of an extracted part of the memory cell array 1.

The wiring 70 extends in the y-direction. A material having a low thermal effect and low resistivity is used for the wiring 70. For example, a metal material such as aluminum (Al), copper (Cu) or tungsten (W), or a silicide material such as tungsten silicide (WSi), nickel silicide (NiSi) or cobalt silicide (CoSi) is used for the wiring 70.

For example, the resistance change storage element 11 has one storage layer (resistance change layer) 12. In the resistance change storage element 11 used for the ReRAM, one storage layer 12 is held between, for example, two electrode layers 71, 73. The storage layer 12 is provided on the wiring 70 via the first electrode layer 71. The second electrode layer 73 is provided on the storage layer 12. The resistance change storage element 11 may be an element in which a transition of the resistance state is demonstrated by the combination of the electrode layers 71, 73 and the storage layer 12, or may be an element in which a transition of the resistance state is demonstrated in the storage layer 12.

The storage layer 12 changes its resistance (resistance state) when a voltage, current, heat or chemical energy is applied to this storage layer 12. The resistance state of the storage layer 12 reversibly changes from the high- to the low-resistance state or vice versa depending on the supply of current or application of voltage. The memory using the resistance change storage element 11 associates the transition of the resistance state with data having two values or having three or more values to recognize data.

For example, a metal oxide, a chalcogenide or a polymer in which conductive particles are dispersed is used for the storage layer 12. For example, a perovskite metal oxide, a binary metal oxide or a transition metal oxide is used as the metal oxide. The perovskite metal oxide includes PCMO $(Pr_{0.7}Ca_{0.3}MnO_3)$, Nb-added $SrTi(Zr)O_3$ and Cr-added $SrTi(Zr)O_3$. The binary metal oxide includes NiO, $TiO_2$ and $Cu_2O$. The chalcogenide includes, for example, Ge—Sb—Te, In—Sb—Te, Ag—In—Sb—Te and Ge—Sn—Te. To the metal oxide and chalcogenide used for the storage layer 12, atoms serving as an impurity for these material may be added.

The first electrode layer 71 functions as a lower electrode of the resistance change storage element 11. The electrode layer 71 also has a function as a barrier metal for preventing the constituent atoms of the storage layer 12 and the wiring 70 from diffusing therebetween, and a function as a bonding layer for preventing the storage layer 12 and the wiring 70 from separating from each other due to the application of a high voltage or high current.

For example, a metal, alloy or conductive compound is used for the electrode layer 71. The electrode layer 71 includes a metal such as platinum (Pt), gold (Au), silver (Ag), iridium (Ir), cobalt (Co), titanium (Ti), aluminum (Al), ruthenium (Ru) or rhodium (Rh). A conductive compound included in the electrode layer 71 is, for example, TiAlN, TiN, SrRuO, RuN, TaN, TaAlN, LaNiO, PtIrOx or PtRhO. These metals and compounds are used as a single-layer film or properly combined into a laminated film for the electrode layer 71. The material used for the electrode layer 71 is set in accordance with the materials of the storage layer 12. However, the present embodiment is not limited to these materials. It is apparent that the material used for the electrode layer 71 varies depending on the material used for the storage layer 12 in the element which functions as the resistance change storage element 11 as a result of the combination of the storage layer 12 and the electrode layers 71, 73.

The second electrode layer 73 is provided on the upper surface of the resistance change storage element 11. The non-ohmic element 15 is provided on the electrode layer 73.

The second electrode layer 73 functions as an upper electrode of the resistance change storage element 11. The second electrode layer 73 also functions as a barrier metal between the resistance change storage element 11 and the non-ohmic element 15 to inhibit the diffusion of their constituent atoms and elements. The electrode layer 73 may further has a function of easing the difference in work function between the materials of the two elements 11, 15, and a function as an electrode for the two elements 11, 15.

Furthermore, a film (buffer layer) for homogenizing the orientation of the films of the non-ohmic element 15 may be inserted between the electrode layer 73 and the non-ohmic element 15. The electrode layer 73 may have a function as a buffer layer. The material used for the electrode layer 73 may be the same as or different from the material used for the electrode layer 71 depending on the material used for the storage layer 12.

A buffer layer, a barrier metal and a bonding layer may be additionally provided between the wirings 70, 79, between the electrode layers 71, 73, 75 and between the elements 11, 15, respectively.

A rectification element such as a PN junction, PIN junction, Schottky or Zener diode is used for the non-ohmic element 15. In the memory cell array 1 shown in FIG. 3, when the non-ohmic element 15 is the PN junction diode, an n-type semiconductor layer 15a is provided on the side of the wiring (bit line) 70, and a p-type semiconductor layer 15a is provided on the side of the wiring (word line) 79.

For example, an element having a metal-insulator-metal (MIM) structure or an element having a silicon-insulator-silicon (SIS) structure may be used for the non-ohmic element 15. The non-ohmic element 15 having the MIM structure or the SIS structure can supply a current (apply a voltage) to the resistance change storage element 11 in two directions, so that the resistance change storage element 11 is driven by a bipolar operation.

The wiring 79 is provided on the upper surface of the non-ohmic element 15 via the third electrode layer 75. The electrode layer 75 functions as, for example, a barrier metal, a bonding layer or an ohmic electrode for the non-ohmic element 15 and the wiring 79. A single-layer film of the above-mentioned metal materials or a laminated film made of Ti and TiN is used for the electrode layer 75.

The wiring 79 extends in the x-direction. A metal material or a silicide material is used for the wiring 79 similarly to the wiring 70.

In FIG. 5, for example, the wiring 70 functions as a bit line, and the wiring 79 functions as a word line.

As shown in FIG. 5, a structure (stack) 10 in which the cell units 10 including the resistance change storage elements 11 and the non-ohmic elements 15 are stacked in the z-direction is also called, for example, a memory plug 10.

In FIGS. 4 and 5, two memory plugs (cell units) 10 face each other in the stacking direction (z-direction) across one wiring 70. The two memory plugs 10 have a mirror structure with respect to the wiring 70. More specifically, the wiring (bit line) 70 is held between two resistance change storage elements 11 stacked in the z-direction, and is shared by the two resistance change storage elements 11. Meanwhile, the wiring 79 is held between two non-ohmic elements 15 stacked in the z-direction, and is shared by the two non-ohmic elements 15. However, as long as the memory cell array can operate normally, the structure and position of the elements 11, 15 relative to the wirings 70, 79 are not limited to the structure shown in FIGS. 4 and 5.

The resistance change memory according to the first embodiment has a plurality of regions (blocks) BK provided in the memory cell array 1. The block BK is used as a control unit for read and write operations. The blocks BK to be targeted for operation (access) are sequentially switched in response to addresses input to the chip.

In the resistance change memory according to the present embodiment, the state machine 7 controls the operation of the whole chip during reading and writing so that a predetermined potential for driving a selected cell in a current selected block may be applied to the word line and bit line in the selected block, and at the same time, a predetermined potential may be applied to the word lines and bit lines in the blocks (hereinafter referred to as unselected blocks) which are not targeted for operation during the operation of the selected block.

In accordance with the control by the state machine 7, the potential generating circuit 8 generates a potential to be applied to the selected block and also generates a potential to be applied to the unselected blocks.

Thus, in the present embodiment, the potential is applied to the word lines and bit lines in the unselected blocks in advance, and these word lines and bit lines are charged before actually targeted for operation.

As a result, when the operation target block is switched from the current selected block to a next selected block, the time stretching from a point where the next selected block is targeted for operation to a point where a selected cell can be driven in the next selected block is reduced.

In a memory such as the resistance change memory that is expected to increase in capacity, the number of memory cells connected to one wiring 70, 79 increases, and the length of the wiring also increases. Accordingly, the charging time for the wiring increases due to delays in the wirings. In contrast, the resistance change memory according to the present embodiment, the wirings in the unselected blocks are charged in advance before the unselected blocks are target for a read/write operation. As a result, deterioration in operation characteristics such as a delay in operation caused during the switching of the blocks BK can be reduced. In consequence, according to the resistance change memory in the first embodiment, memory operation characteristics can be improved.

(3) Operation (a) Basic Operation

First, the operation of the resistance change memory according to the first embodiment is described with reference to FIG. 6. Here, FIGS. 1 and 3 are also used =for explanation.

Figure 6:
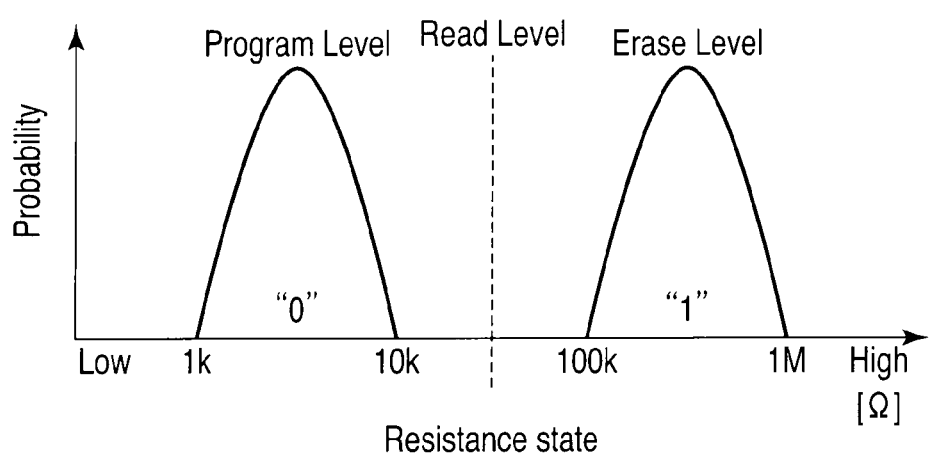
FIG. 6 is a graph for illustrating the operation of the resistance change memory.

FIG. 6 is a schematic diagram for illustrating the relation between the resistance state of the resistance change storage element 11 and data. In FIG. 6, the horizontal axis indicates the resistance state (resistance) of the resistance change storage element, and the vertical axis indicates the existence probability (distribution) of the resistance change storage element relative to a given resistance state.

As described above, data is allocated to the resistance change storage element 11 depending on how great its resistance is, and the resistance change storage element 11 is used as a binary memory or multilevel memory.

As shown in FIG. 6, the binary memory (single level cell [SLC]) stores one binary digit, namely, binary 0 or binary 1, depending on how great the resistance (distribution) of the resistance change storage element is.

In the example shown in FIG. 6, binary 0 is allocated to the distribution of the low-resistance state of the resistance change storage element 11, and binary 1 is allocated to the distribution of the high-resistance state of the resistance change storage element. For example, binary 0 is set as a write (program) level, and binary 1 is set as an erase level. In FIG.

6, the range of resistances corresponding to binary 0 is set at 1 to 10 kΩ, and the range of resistances corresponding to binary 1 is set at 100 kΩ to 1 MΩ. However, the present embodiment is not limited thereto. The range of resistances corresponding to the data may be properly set within the variable range of resistance (resistance state) of the resistance change storage element. It is obvious that the resistance corresponding to the data also varies depending on the material used for the element 11.

Moreover, within the range of the resistance of one resistance change storage element, three or more write levels may be set in accordance with how great its resistance is. A memory in which one resistance change storage element stores three or more values (two bits) of data is called a multilevel memory.

The write and read operations of the resistance change memory according to the present embodiment are described below. The resistance change memory using the unipolar operation is described below by way of example.

In order to write data to the resistance change storage element (selected cell) 11, energy such as a voltage or current is applied to the resistance change storage element 11 so that the resistance of the resistance change storage element targeted for writing may be within the distribution of the resistance state corresponding to the data to be written. As a result, the resistance state of the resistance change storage element 11 changes, and the resistance change storage element 11 stores data corresponding to the resistance state in a nonvolatile manner. In the case described below in connection with the present embodiment, the write operation is performed by the application of a voltage (or supply of current) having a predetermined pulse shape to the resistance change storage element.

As shown in FIG. 3, when the memory cell array 1 has a cross-point circuit configuration, the cell unit 10 including the resistance change storage element 11 and the non-ohmic element 15 is connected between the bit line BL and the word line WL.

Writing to the resistance change storage element (selected cell) 11 is performed by setting a predetermined potential difference (write voltage) between, for example, the bit line BL and the word line WL.

For example, the resistance change storage element 11 changes from the high- to the low-resistance state or vice versa depending on the magnitude or the pulse width of the write voltage to be applied. In the present embodiment, the operation of changing the resistance state of the resistance change storage element from the low-resistance state to the high-resistance state is called a reset operation, and the operation of changing the resistance state from the high-resistance state to the low-resistance state is called a set operation.

For example, a write voltage for changing the resistance state of the resistance change storage element 11 from the low-resistance state to the high-resistance state is applied across the bit line and the word line. As a result, the resistance of the resistance change storage element 11 changes, and binary 1 is written to the resistance change storage element (memory cell) 11. Moreover, a write voltage for changing the resistance state of the resistance change storage element 11 from the high-resistance state to the low-resistance state is applied across the bit line and the word line. As a result, the resistance of the resistance change storage element 11 changes, and binary 0 is written to the resistance change storage element (memory cell) 10. The resistance change storage element 11 maintains the changed resistance state even if the application of the potential is stopped.

Thus, the resistance state of the resistance change storage element 11 is changed by the applied write voltage, and predetermined data is written to the selected cell.

Erasing data from the resistance change storage element 11 is the operation of changing the resistance state of the resistance change storage element 11 to a resistance state corresponding to the erase level. This operation is substantially similar to the write operation. In the example described above, when the data corresponding to the erase level is binary 1, the reset operation is performed on the resistance change storage element 11.

Data is read from the resistance change storage element (selected cell) 11 in the following manner.

As shown in FIG. 6, a read level corresponding to a predetermined resistance is set between the distributions of the resistance states corresponding to data.

Data is read from the resistance change storage element by judging whether the resistance of the resistance change storage element is higher or lower than a resistance indicated by the read level. For example, a sense potential or sense current provided to the bit line to which the selected cell is connected fluctuates in response to the resistance of the resistance change storage element 11. The amount of the fluctuation is detected by the sense amplifier in the column control circuit 2. Whether the data stored in the element 11 is binary 1 or binary 0 is determined by the result of a comparison between the fluctuation amount and a reference value (read level), and the determined data is externally read as the data DT.

Thus, data is determined by the comparison between the resistance of the resistance change storage element 11 and the read level, and read.

(b) Overall Operation

Figure 8:
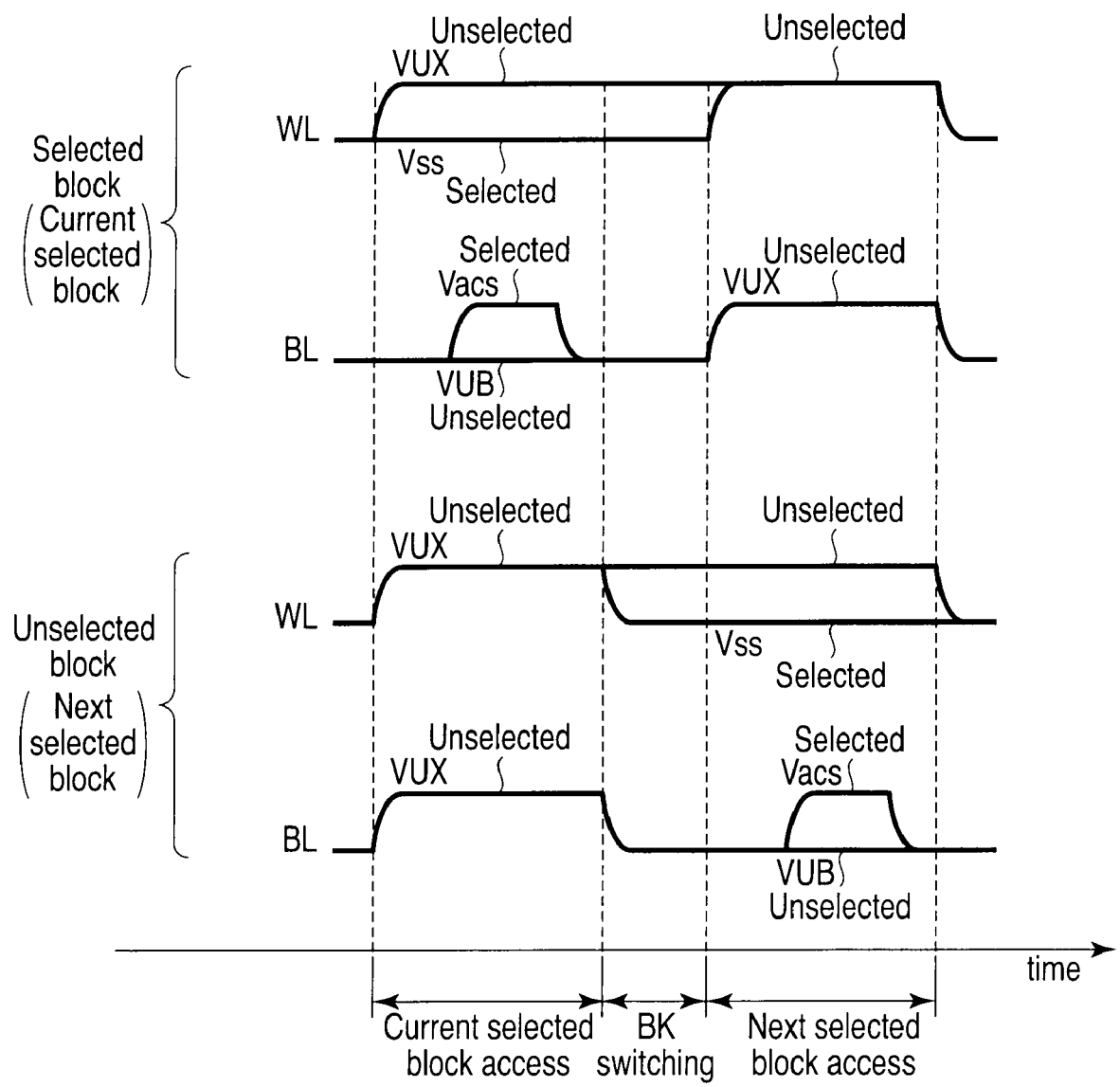
FIG. 8 is a timing chart showing the operation of the resistance change memory according to the first embodiment.

The operation of the resistance change memory according to the first embodiment is described with reference to FIGS. 7A, 7B and 8. Here, FIG. 1 is also used to describe the operation of the resistance change memory according to the present embodiment. FIGS. 7A and 7B show an example of how the blocks in the memory cell array are during the operation of the resistance change memory according to the present embodiment. FIG. 8 shows a timing chart of the operation of the resistance change memory according to the present embodiment.

When there is a request from the outside to the resistance change memory to write or read data, a command signal CMD indicating a requested command (operation) is input to the command interface 4 shown in FIG. 1.

In addition, the address (selected address) ADR of the resistance change storage element (selected cell) to be targeted for operation is input to the address buffer 6. The input address signal ADR includes the address (block address) of the block in the memory cell array in which the selected cell is provided, the address (row address) of the word line to which the selected cell is connected, and the address (column address) of the bit line to which the selected cell is connected. One address signal ADR or a plurality of address signals ADR may be input for one command signal CMD.

Furthermore, when the command signal CMD indicates data write, the data DT is externally input to the data input/output buffer 5 together with the command signal CMD and the address signal ADR.

The command interface 4 transfers the command signal CMD to the state machine (control circuit) 7. The address buffer 6 transfers the address signal ADR to the state machine 7. Moreover, the address signal ADR is output to the state machine 7, and also output to the column control circuit 2 and the row control circuit 3.

In accordance with the command signal CMD and the address signal ADR, the state machine 7 controls the operations of the column control circuit 2, the row control circuit 3 and the potential generating circuit 8.

In accordance with the input address signal ADR, the state machine 7 distinguishes the access target block (selected block) from other blocks (unselected blocks). For example, when two or more address signals ADR are input, the state machine 7 distinguishes, from one another, the selected block (current selected block) which is first targeted for access, the block (next selected block) which is targeted for access after the current selected block, and the blocks (unselected blocks) other than the current selected block and the next selected block.

The state machine 7 causes the potential generating circuit 8 to generate potentials Vacs, Vss, VUB, VUX to be applied to the word lines and the bit lines in the selected block and the unselected blocks shown in FIG. 7A.

For example, in the memory cell array 1 having the connection shown in FIG. 3, predetermined potentials are applied to the selected bit lines and the selected word lines in the selected block so that a potential difference (voltage) in a forward bias direction may be applied to the diode 15 in the cell unit (referred to as a selected cell unit or selected circuit) 10 including the selected cell.

As shown in FIG. 7A, the potential (hereinafter referred to as a BL select potential) Vacs is applied to a selected bit line BLS to which a selected cell unit (selected cell) 10S is connected. The potential (hereinafter referred to as a WL select potential) Vss is applied to a selected word line WLS to which the selected cell 10S is connected. During a read, the BL select potential Vacs (Vread) is, for example, about 2 to 3 V, and the WL select potential Vss is, for example, about 0 to 0.5 V.

Furthermore, in the selected block, the unselect potential (first unselect potential) VUB is applied to an unselected bit lines BLU, and the unselect potential (second unselect potential) VUX is applied to an unselected word lines WLU. For example, the unselect potential VUX is a potential higher than the BL select potential Vacs. The unselected bit line BLU is a bit line to which the selected cell unit 10S is not connected, and the unselected word line WLU is a word line to which the selected cell unit 10S is not connected. A cell unit 10U connected to the unselected bit line BLU and the unselected word line WLU will hereinafter be referred to as an unselected cell unit 10U.

The unselect potential VUB is, for example, about 0 to 0.5 V. The unselect potential VUX is, for example, about 3 to 7 V. When the diode 15 is connected to bit line $BL_i$ and word line $WL_j$ as shown in FIG. 3, the potential VUX (e.g., 3 V) is applied to the cathode side of the diode 15, and the potential VUB (e.g., 0 V) is applied to the anode side of the diode 15, in the unselected cell unit 10U in FIG. 7A. That is, a voltage in a reverse bias direction is applied to the diode 15. Thus, substantially no current runs through the unselected cell connected between the unselected bit line and the unselected word line, and crosstalk during a read is prevented.

In the cross-point memory cell array 1, there is an unselected cell (hereinafter referred to as a semi-selected cell) connected to one of the selected bit line BLS and the selected word line WLS. A potential difference between the BL select potential Vread and the unselect potential VUX is applied, in a reverse bias direction to the diode 15, to a cell unit (referred to as a semi-selected cell unit) 10H which includes the semi-selected cell and which is connected between the selected bit line BLS and the unselected word line WLU. A potential difference between the WL select potential Vss and the unselect potential VUB is applied to the semi-selected cell unit 10H connected between the selected word line WLS and the unselected bit line BLU. This potential difference is substantially zero. Thus, substantially no current runs through the unselected cell connected to one of the selected bit line BLS and the selected word line WLS.

In the resistance change storage element for the unipolar operation, the voltage and pulse width of the BL select potential Vacs only vary between the value Vread for reading and the value for writing, and the operation of reading is substantially the same as the operation of writing. However, the voltages and pulse widths of the unselect potentials VUB, VUX are set in accordance with the voltage and pulse width of the write voltage used for a write.

Reading is taken as an example below to describe the operation of the resistance change memory according to the present embodiment.

As described above, in the resistance change memory according to the present embodiment, a plurality of blocks BK provided in the memory cell array 1 are used as the control units for operation.

The state machine 7 causes the column control circuit 2 and the row control circuit 3 to activate the selected block in accordance with the address signal indicating the selected block and the selected cell. As a result, the select potentials Vread, Vss and the unselect potentials VUB, VUX are applied to the bit lines BLS, BLU and the word lines WLS, WLU in the selected block BK via the column control circuit 2 and the row control circuit 3.

As shown in FIGS. 7A and 8, when data is read from the selected cell, the unselect potential VUX is first applied to the unselected word line WLU. After the potential of the unselected word line WLU has reached a predetermined level (VUX), the BL select potential Vread (Vacs) is applied to the selected bit line BLS. In FIG. 8, by way of example, the WL select potential Vss applied to the selected word line WLS is set at 0V, and the unselect potential VUB applied to the unselected word line WLU is set at 0V.

Furthermore, the BL select potential Vread is applied to the selected bit line BLS during a predetermined period, and data is read from the selected cell. After the data is read, the potential of the selected bit line BLS is changed from the BL select potential Vread to zero.

Thus, in the selected block BK, the selected cell (selected cell unit) 10S connected to the selected bit line BLS and the selected word line WLS is accessed. Data is then read from the selected cell 10S. The read data is input to the data input/output buffer 5 via the column control circuit 2. The data input/output buffer 5 externally transfers the data DT. When the data is written to the selected cell, the data DT input to the data input/output buffer 5 is transferred to the selected cell via the column control circuit 2.

Here, in the resistance change memory according to the first embodiment, a potential is also applied to one or more unselected blocks BK in the memory cell array 1 during the access period of the selected block BK and the selected cell.

The state machine 7 causes the potential generating circuit 8 to generate a potential to be applied to the selected block and, at the same time, generate a potential to be applied to the unselected block. As shown in FIG. 7B, the potential generating circuit 8 generates the unselect potential VUX as a potential to be applied to an unselected bit line BLU' and an unselected word line WLU' in the selected block BK. The unselect potential VUX ranges from 3 to 7 V.

The potential VUX applied to the unselected bit line BLU' and the unselected word line WLU' in the unselected block may be different from the potential VUX applied to the unselected bit line BLU and the unselected word line WLU in the selected block. Moreover, in the unselected block, the potential applied to the unselected bit line BLU' may be equal to or different from the potential applied to the unselected word line WLU'.

The state machine 7 applies the potentials Vread, Vss to the selected block BK, and at the same time, applies the potential VUX generated for unselected blocks to one or more unselected blocks BK via the column control circuit 2 and the row control circuit 3.

Thus, as shown in FIG. 8, the unselect potential VUX is applied to the word lines and the bit lines in the unselected blocks during the access period of the selected block (current selected block).

It is apparent that even if a potential is applied to the unselected bit line BLU' and the unselected word line WLU' in the unselected block BK as in the present embodiment, the resistance change storage element (unselected cell) in the unselected block is not targeted for reading or writing during reading or writing in the selected cell.

The state machine 7 switches the operation target selected block to the next selected block after the end of the operation performed on the selected block. As described above, the next selected block is an unselected block to be targeted for operation after the current selected block.

For example, as shown in FIG. 8, the potentials of the selected bit line, selected word line and unselected word line in the next selected block are changed from VUX to the Vss, VUB during the period of switching blocks. On the other hand, the potential of the unselected word line WL is maintained at the VUX.

After the predetermined block switching period has passed, the next selected block among the unselected blocks is activated as a selected block, and a predetermined operation is performed on the activated block.

Here, in the present embodiment, a potential is applied to the bit lines and the word lines in the unselected blocks during the selected block access period. While the potential is being applied to the bit lines and the word lines in the unselected blocks, the blocks BK are switched, and one of the unselected blocks is targeted for the next operation as a selected block. During the access period after the block switching, a predetermined potential is applied to the selected bit line in the selected block (the next selected block in FIG. 8). As a result, data is read from (or written to) the selected cell.

In FIG. 8, the current selected block is an unselected block during the access period of the next selected block. Thus, during the access period of the next selected block, the unselect potential is applied to the block (also referred to as a previous selected block) which was a selected block during the previous access period. Therefore, if the current selected block is switched to the unselected block as in the access period of the next selected block, the unselect potential VUX is applied to the bit line and the word line in this block as shown in FIG. 7B. The application of a potential to the word line and the bit line in the previous selected block may be started during the block switching period.

As shown in FIG. 8, data is read from (or written to) the selected cell in the next selected block so that the operation is not put on standby during a period before the unselected word line WL in the next selected block is charged to a predetermined potential (e.g., the potential VUX).

The operation as described above is sequentially performed in response to a given command signal CMD and a given address signal ADR, and the operation of the resistance change memory according to the present embodiment is completed.

As described above, in the resistance change memory according to the first embodiment, a plurality of blocks are provided in the memory cell array 1. Moreover, during the operation performed on the resistance change memory, the block is switched from a selected block to an unselected block or from an unselected block to a selected block, so that data is read from or written to a selected cell.

As shown in FIGS. 7A, 7B and 8, in the resistance change memory according to the present embodiment, the unselect potential VUX is applied to the unselected blocks during the access period of the selected block, and the bit lines BLU' and the word lines WLU' in the unselected block are charged.

Thus, in the resistance change memory according to the present embodiment, the bit line and the word line in the block to be targeted for operation in the next cycle are charged in advance during the access period of the selected block and during the block switching period. Therefore, the selected cell can be substantially operated at once after the switching of blocks without any delay attributed to the charging of the wirings. Consequently, the resistance change memory according to the present embodiment allows the selected cell to be accessed at high speed.

The resistance change memory according to the present embodiment allows a reduction in the charging period of the wirings (here, the unselected word lines) and therefore allows a reduction in the access period of the block that has been switched from the unselected block to the selected block. Further, the resistance change memory according to the present embodiment can also contribute to a reduction in block switching time.

In FIG. 8, the block switching period is provided at the time of switching the selected block to ensure reliability in the operation of the resistance change memory. However, when high-speed performance of the operation is requested, the resistance change memory according to the present embodiment can be normally driven even without the block switching period because a potential is applied to the unselected block in advance.

As shown in FIG. 8, for stable operation of the resistance change memory, the application of the potential to the selected bit line in the next selected block is preferably started after a predetermined time has passed since the beginning of the access period of the next selected block. However, since the wirings are charged to the predetermined potential at the start of the operation in the present embodiment, the application of the potential to a high-potential selected line (here, selected bit line) in the next selected block may be started immediately after the beginning of the access period of the next selected block. In this case, the operation of the resistance change memory can be increased in speed. When the block is switched from the next selected block to the current selected block, the potential of the selected bit line may be decreased from the unselect potential VUB to nearly the BL select potential Vread instead of being decreased from the unselect potential VUB to ground potential Vss.

Furthermore, for stable operation, the application of the potential to the wiring (e.g., the selected bit line) in the selected block is preferably started after the potential of the wiring in the block (previous selected block) which has been switched from the selected block to the unselected block has reached a predetermined potential (e.g., the unselect potential VUX). The application of the potentials to the unselected bit lines/unselected word lines in the selected block and the next selected block may be started at the same time or started by different timings.

Furthermore, as shown in FIG. 8, if the next selected block is targeted for access as a result of switching the selected block, the bit line/word line selected during the access to the current selected block change to an unselected bit line/unselected word line. When the bit line/word line in the previous selected block that change from the selected state to the unselected state have a low potential (e.g., Vss), the application of the potential (e.g., VUX) to the bit line/word line may be started immediately after the end of the operation performed on the previous selected block or during a period before the beginning of the access period of the next selected block.

As described above, in the resistance change memory according to the present embodiment, a potential is applied to the unselected block during a period in which operation is performed on the selected block. Thus, the block switching period and the wiring charging period are reduced.

In consequence, according to the resistance change memory in the first embodiment, its operation characteristics can be improved.

(B) Second Embodiment

A resistance change memory according to the second embodiment is described with reference to FIGS. 9 to 12. It is to be noted that the same components and operation as those in the resistance change memory according to the first embodiment are not repeatedly described in the present embodiment.

When a resistance change memory having a high storage capacity is configured, the number of blocks and memory cells provided in a memory cell array 1 is greater, and the length of bit lines and word lines is also greater. Accordingly, the number of unselected bit lines and unselected word lines to which a potential is applied during the operation of the memory is greater. When a diode 15 is connected between the bit line and the word line as shown in FIG. 3, a weak leakage current runs across the bit line and the word line via the diode in a reverse bias state even if the voltage applied across the bit line and the word line is a voltage in a reverse bias direction to the diode 15. As described above, when the leakage current from a great number of diodes is taken into consideration in the resistance change memory having a high storage capacity, the amount of this current is considerable.

Therefore, when a potential is applied to all the unselected blocks in the resistance change memory, there may be a notable increase of power consumption.

Figure 9:
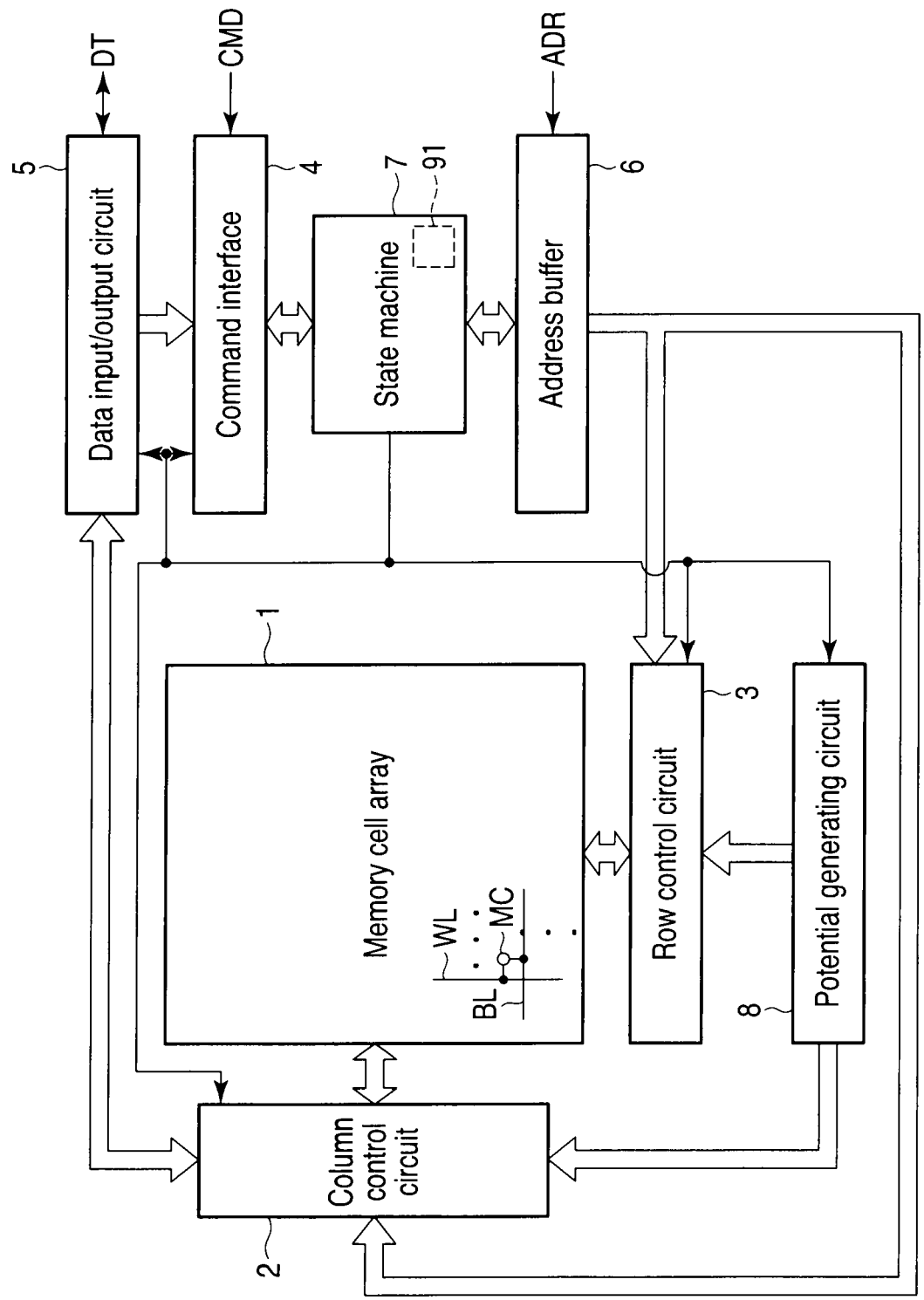
FIG. 9 is a block diagram showing a resistance change memory according to a second embodiment.
Figure 10:
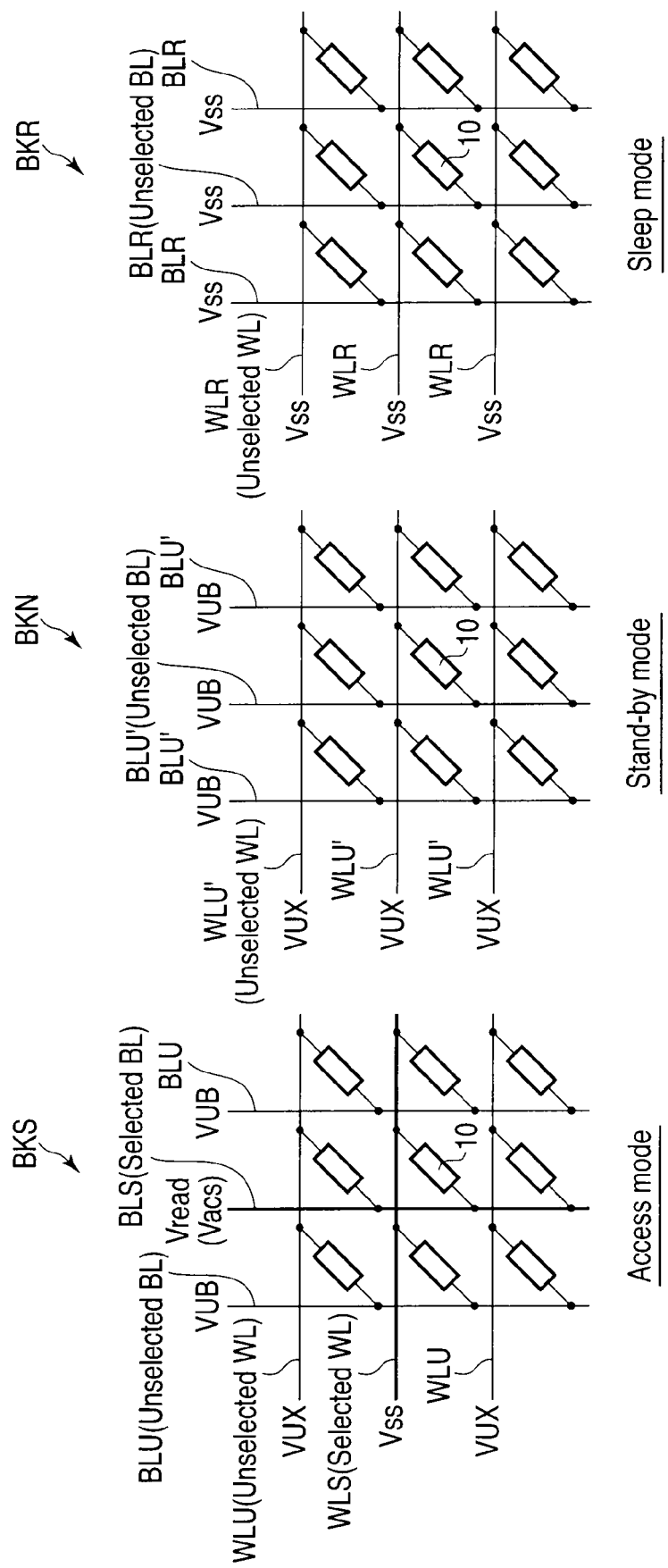
FIG. 10A is schematic diagram for illustrating the operation of the resistance change memory according to the second embodiment.
FIG. 10B is schematic diagram for illustrating the operation of the resistance change memory according to the second embodiment.
FIG. 10C is schematic diagram for illustrating the operation of the resistance change memory according to the second embodiment.

In the resistance change memory according to the second embodiment, three operation modes are set for the blocks provided in the memory cell array 1, as shown in FIGS. 10A, 10B and 10C. As shown in FIG. 9, a state machine 7 has, for example, a parameter holder 91. The parameter holder 91 holds parameter sets corresponding to the three operation modes, respectively. The state machine 7 controls the operation of each block BK in the memory cell array 1 during the operation of the memory in accordance with these operation modes.

For example, the state machine 7 drives a selected block in an access mode. As shown in FIG. 10A, in the access mode corresponding to the first parameter, select potentials Vacs, Vss are applied to a selected bit line and a selected word lines, and unselect potentials VUB, VUX are applied to an unselected bit line BLU and an unselected word line WLU, in a selected block BKS.

In this access mode, a read potential Vread is used as a select potential Vacs during reading. A potential having a voltage or pulse width different from that of the potential Vread is used as the select potential Vacs during a write. Moreover, the select potential Vacs having a different voltage or pulse width is used during a write depending on whether binary 0 or binary 1 is written. In the access mode, the select potential Vacs used for writing or reading is determined by an input command signal CMD.

The state machine 7 drives, in a standby mode corresponding to the second parameter, an unselected block (next selected block) targeted for access after the selected block. As shown in FIG. 10B, in the standby mode, the unselect potential VUB (e.g., 0 to 0.5 V) is applied to a bit line BLU', and the unselect potential VUX (e.g., 3 to 7 V) is applied to an unselected word line WLU', in a next selected block BKN. In the standby mode, the potential applied to the unselected bit line BLU' may be the same as or different from the unselect potential VUX for the unselected word line WLU'.

Furthermore, the state machine 7 drives all the unselected blocks but the next selected block in a sleep mode corresponding to the third parameter shown in FIG. 10C, in the sleep mode, a potential (third unselect potential) lower than the unselect potential VUX in the standby mode is applied to unselected bit lines BLR and unselected word lines WLR in unselected blocks BKR other than the next selected block. For example, in the unselected block in the sleep mode, the potentials of the unselected bit lines BLR and the unselected word lines WLR are set at ground potential Vss (e.g., 0 to 0.5 V). In this case, substantially no current is supplied to the block driven in the sleep mode.

For example, when a certain operation is performed on the memory, the state machine 7 allocates the access mode, the standby mode and the sleep mode to the selected block and the unselected blocks in the order of input addresses, thereby controlling the operation of the whole memory.

Figure 11:
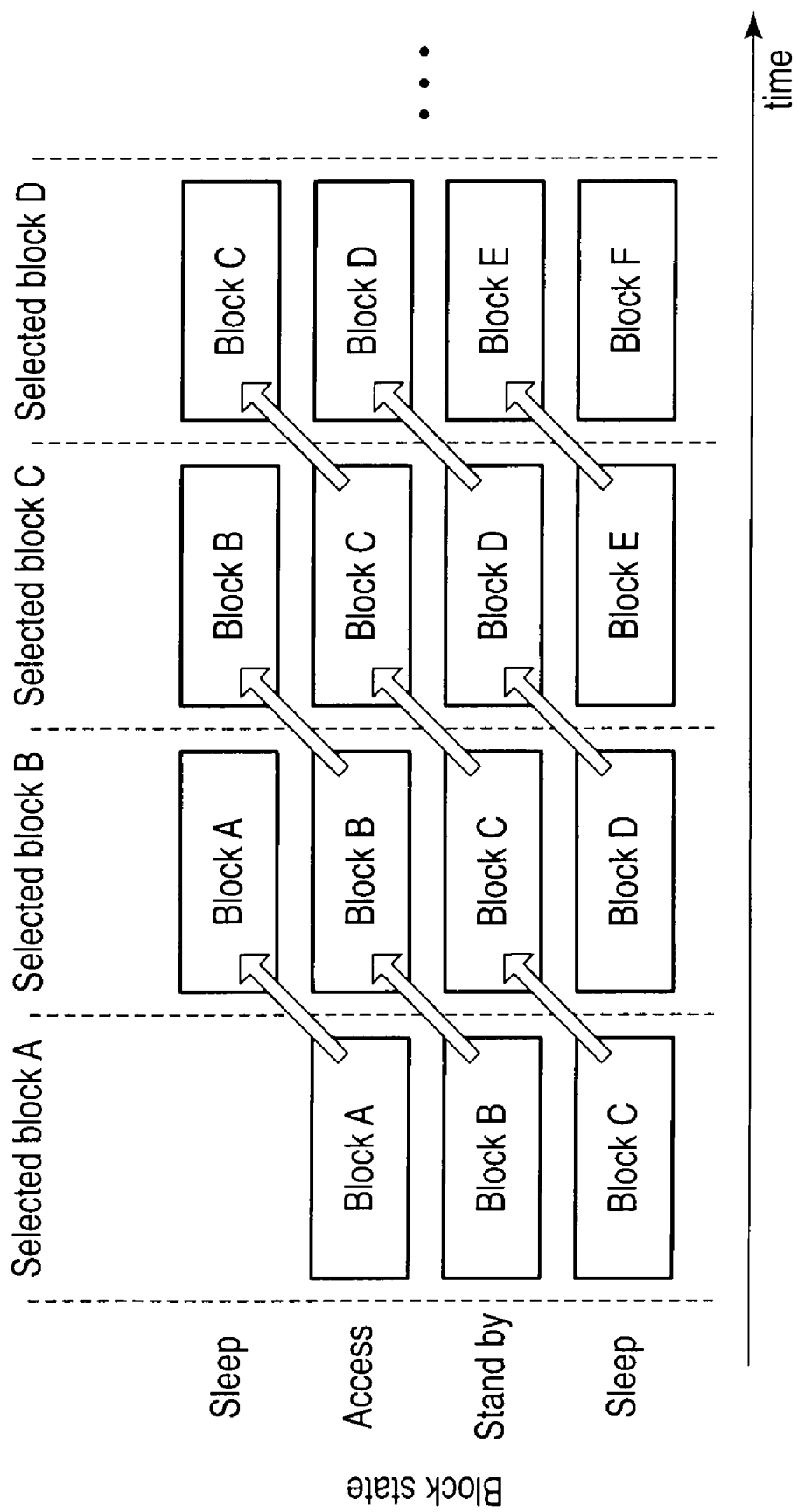
FIG. 11 is a schematic diagram for illustrating the operation of the resistance change memory according to the second embodiment.
Figure 12:
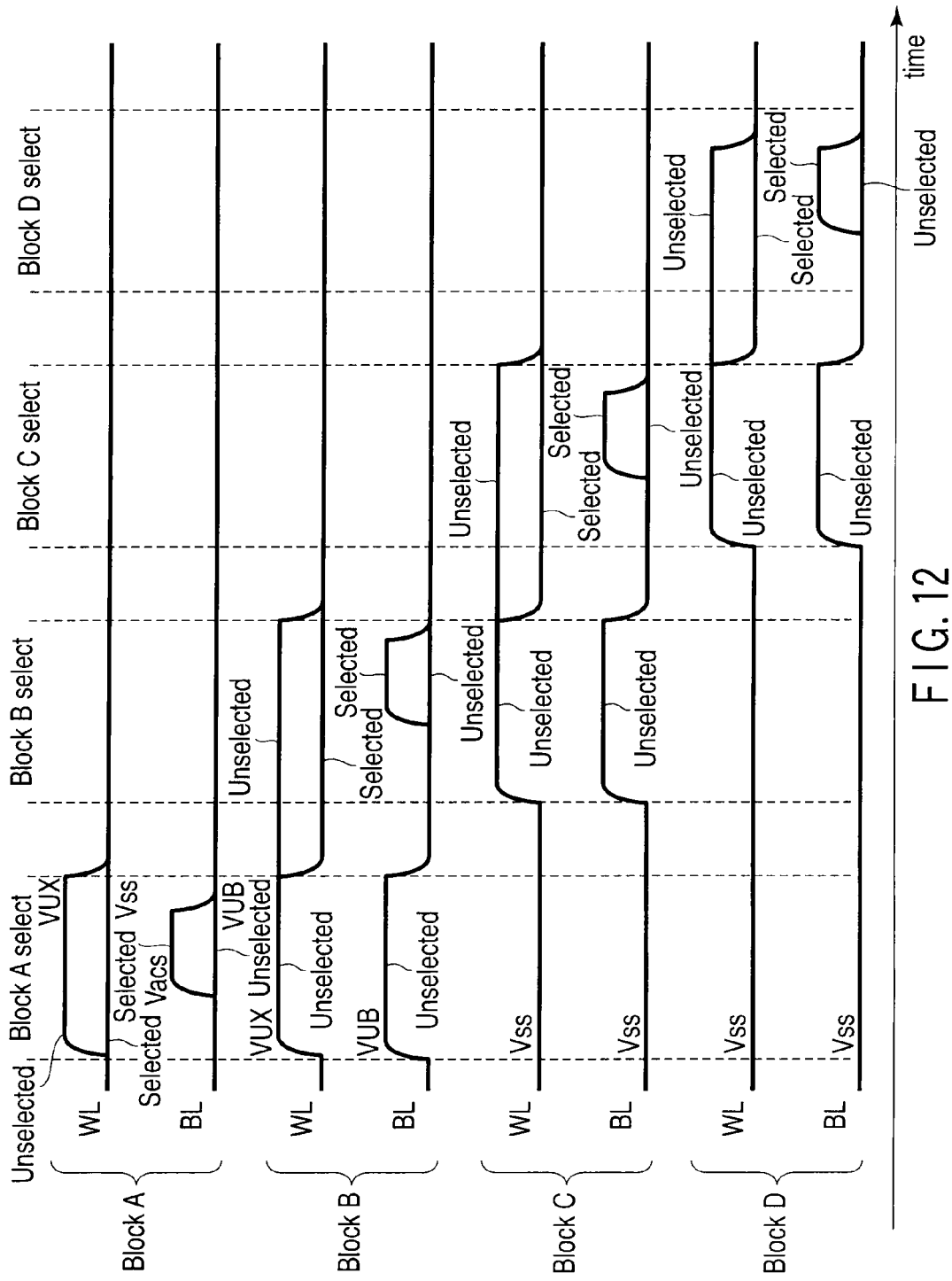
FIG. 12 is a timing chart showing the operation of the resistance change memory according to the second embodiment.

The operation of the resistance change memory according to the second embodiment is described with reference to FIGS. 11 and 12. FIG. 11 is a schematic diagram showing the transition of the operation mode of each block in the operation of the resistance change memory according to the present embodiment. In FIG. 11, the horizontal axis indicates time, and the vertical axis indicates the state of the blocks. FIG. 12 is a timing chart showing the operation of the resistance change memory according to the present embodiment.

In the case described below, the blocks are selected (accessed) in a preset order. Here, the selected block is switched in the order of a block A, block B, . . . , block E and block F. For example, a parameter relevant to this operation is also held by the parameter holder 91.

During the operation of the resistance change memory, the state machine 7 controls the whole chip so that a potential may be applied to the block BKS in the access mode and to a block BKU in the standby mode.

In the example shown in FIG. 11, block A is first driven in the access mode as the selected block BKS. Block B is an unselected block, but is to be a selected block after block A. Therefore, block B is driven in the standby mode as the next selected block BKN during the access period of block A.

Furthermore, block C and the following blocks D to F are accessed after the next selected block (block B), and are therefore driven in the sleep mode as unselected blocks.

Thus, as shown in FIG. 12, a potential is applied to block A (selected block) in the access mode. Then, in accordance with the input selected address, the select potentials Vacs, Vss are applied to a selected bit line BLS and a selected word line WLS in block A, and the unselect potentials VUB, VUX are applied to the unselected bit line BLU and the unselected word line WLU.

Simultaneously with the application of the potential to block A in the access mode, a potential is applied to block B (next selected block) in the standby mode. The unselect potential VUB is applied to all unselected bit lines WLU' in block B, and the unselect potential VUX is applied to all unselected word lines WLU' in block B. During the access period of block A, that is, before targeted for actual operation, the bit line BLU' and the word line WLU' in block B which is the next selected block are charged by the applied potentials VUB, VUX.

Furthermore, during the access period of block A, no potential is applied to blocks C to E in the sleep mode, and the unselected bit lines BLR and the unselected word lines WLR in blocks C to E are set at ground potential Vss.

Thus, among the unselected blocks, the high potentials VUX, VUB are only applied to the next selected block BKN in the standby mode, and no potential is applied to the remaining unselected blocks in the sleep mode. Therefore, power consumption during the operation of the memory is reduced.

After the end of the driving of block A in the access mode, the state machine 7 switches the selected block in accordance with the set order. That is, block B changes in state from the next selected block to the current selected block BKS, and the block C changes in state to the next selected block BKN. Block D to block F targeted for operation after block C are unselected blocks. Block A after completion of its operation becomes an unselected block.

As a result, block B as the selected block BKS is driven in the access mode, and the select potentials Vacs, Vss are applied to the selected bit line BLS and the selected word line WLS in block B. For example, a selected cell in block B is driven while the unselected word line WLU' in block B is charged to nearly the potential VUX during the access period of block A. This allows a reduction in the time for the potential of the unselected word line WLU to reach the unselect potential VUX from a low potential (e.g., Vss) during the access period of the selected block. Thus, the selected cell can be accessed at high speed without any delay attributed to the charging time of the wirings.

A potential is applied to block C as the next selected block, and the unselect potential VUX is applied to the unselected bit line BLU' in block C. Further, the unselect potential VUB is applied to the unselected word line WLU'.

Furthermore, blocks D to E to be targeted for operation after block C, and block A which has completed its operation are driven in the sleep mode. No potential is applied to these blocks A, D to E. That is, the potentials of the bit lines BLR and the word lines WLR in blocks A, D to E are set at ground potential Vss.

After block B is driven in the access mode as a selected block, the state machine 7 again switches the selected block in the set order. That is, block C changes from the next selected block to a selected block, and block C is driven in the access mode during the access period of block C. Block D is driven in the standby mode as the next selected block BKN, and the bit line and word line in block D are charged by the unselect potentials VUB, VUX applied to block D. Blocks A, E, F and block B which has been already accessed in the previous operation cycle are unselected blocks to which no potential is applied, and are driven in the sleep mode.

The state machine 7 repeats the operation described above until the block to be last targeted for access in response to a given command signal CMD is selected. When the block to be last targeted for access is selected, the remaining unselected blocks except the selected block may be driven in the sleep mode. Alternatively, among the remaining unselected blocks except the selected block, the block first selected in response to the next command signal CMD may be driven in the standby mode as the next selected block.

As described above, in the resistance change memory according to the present embodiment, during the operation performed on the selected block BKS, the control circuit 7 previously applies a potential to the bit line and word line in the unselected block (next selected block) BKN targeted for operation after the selected block, and applies no potential to the bit lines and word lines in the unselected blocks BKR other than the next selected block.

Thus, the resistance change memory according to the present embodiment can increase the speed of its operation and reduce power consumption during its operation even if the storage capacity of the memory cell array 1 increases.

Accordingly, the number of unselected blocks to which the unselect potentials VUB, VUX and Vss are applied decreases. This leads to a reduced load on the operation of the potential generating circuit 8 for generating the unselect potentials and to stable operation of the resistance change memory.

Although the operation (sequential operation) for causing the blocks to be targeted for access in a given order has been described in the present embodiment, the second embodiment is not limited to this. For example, the state machine 7 may distinguish, from one another, the current selected block, the next selected block, and the selected blocks (unselected blocks) after the next selected block in accordance with sequentially input random select address signals. The state machine 7 may then set these blocks to the access mode, the standby mode and the sleep mode.

For example, when the address signals ADR are input in the order of block C, block F and block A, the state machine 7 determines block C to be a current selected block, and drives block C in the access mode. In accordance with the order of the input address signals ADR, the state machine 7 determines block F to be a next selected block, and drives block F in the standby mode. The state machine 7 applies a potential to block F simultaneously with the application of the potential to block C. The state machine 7 also determines block A to be an unselected block, and drives block A in the sleep mode. After the end of the operation performed on block C, the state machine 7 switches the operation mode of each block as in the operation described with reference to FIGS. 11 and 12.

It is thus apparent that the operation for randomly targeting the blocks for access (random operation) has advantages similar to those in the operation described with reference to FIGS. 11 and 12.

As described above, the resistance change memory according to the present embodiment enables high-speed operation and reduced power consumption.

In consequence, according to the resistance change memory in the second embodiment, its operation characteristics can be improved.

(C) Third Embodiment

A resistance change memory according to the third embodiment is described with reference to FIGS. 13 and 14.

In the resistance change memory according to the third embodiment, potential application is simultaneously started for a selected block in the access mode and for an unselected block (next selected block) in the standby mode. However, the present embodiment is not limited thereto. Potential application may be started for the selected block and the next selected block by different timings during the operation period of the selected block.

As shown in FIG. 13, in the resistance change memory according to the present embodiment, a state machine 7 has a block application potential detector 95 for detecting, for example, the state of potential application to each block. The block application potential detector 95 detects, for example, whether an unselected wiring (e.g., unselected word line) set at a high potential in the selected block has reached a predetermined potential. For example, in accordance with the operation status of a column control circuit 2, a row control circuit 3 and a potential generating circuit 8, the block application potential detector 95 detects whether a bit line and word line in the block operating in the access mode have reached the predetermined potential. However, the block application potential detector 95 may directly detect the potential application to the block in the memory cell array 1.

Figure 14:
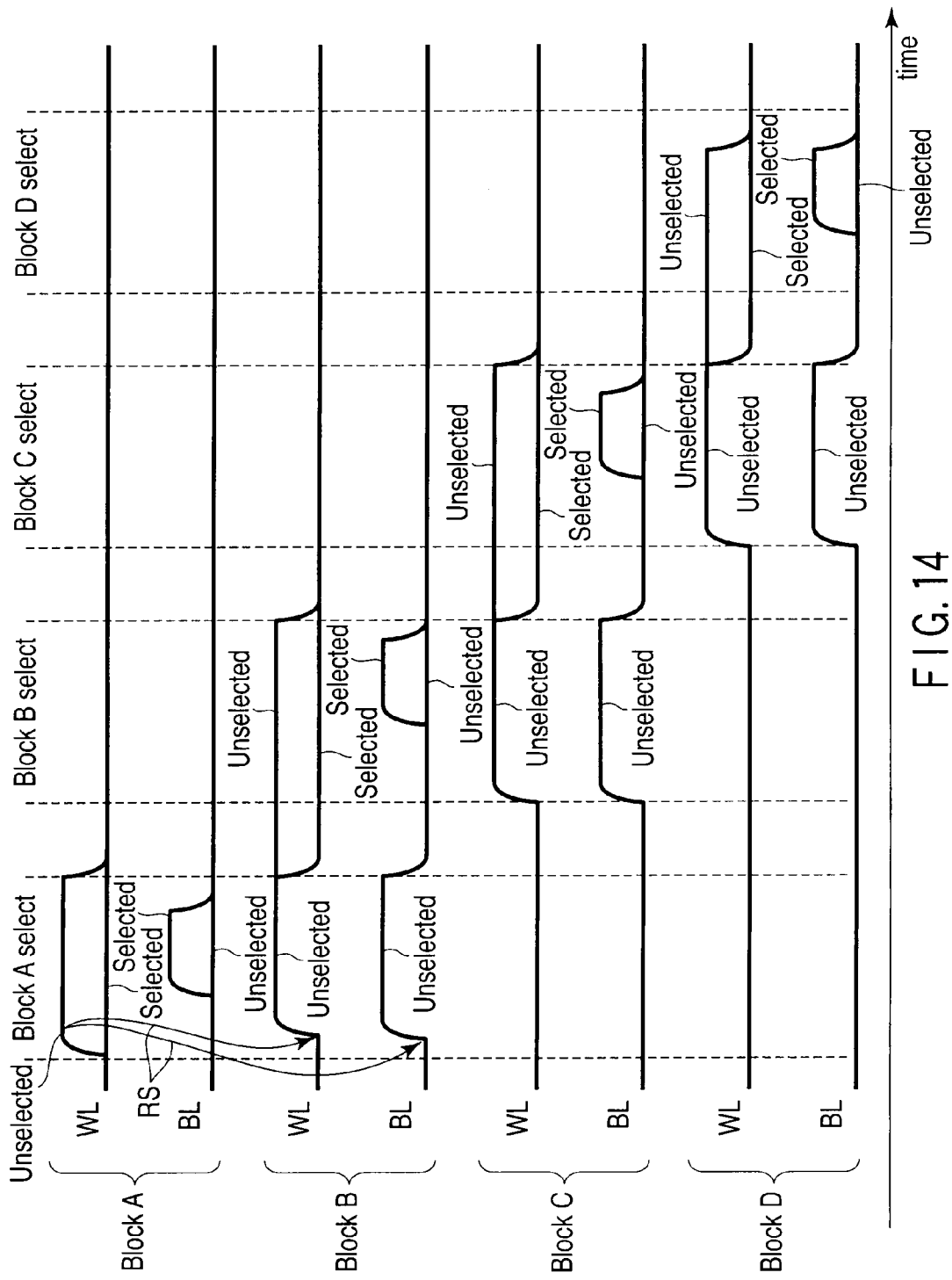
FIG. 14 is a timing chart showing the operation of the resistance change memory according to the third embodiment.

As shown in FIGS. 13 and 14, the block application potential detector 95 outputs a ready signal RS when, for example, the potential of an unselected wiring (unselected word line WLU) set at a high potential in a selected block BKS has reached a predetermined unselect potential VUX. For example, the state machine 7 holds a parameter corresponding to the ready signal RS in a parameter holder 91.

The ready signal RS is input to the column control circuit 2, the row control circuit 3 and the potential generating circuit 8 each corresponding to an unselected block. The operations of the circuits 2, 3, 8 are controlled by the ready signal RS. In the present embodiment, the unselected block controlled by the ready signal RS is referred to as an unselected block (next selected block) in the standby mode for ease of explanation. However, it is obvious that all of the unselected blocks in the memory cell array 1 may be controlled by the ready signal RS.

The column control circuit 2, the row control circuit 3 and the potential generating circuit 8 to which the ready signal RS has been input start the application of a potential to the unselected block (next selected block) BKN in the standby mode. Further, the word line in the next selected block is charged up to the unselect potential VUX. As shown in FIG. 14, operation is controlled so that a potential is applied to the word line in the next selected block after the potential of the unselected word line in the selected block has reached the unselect potential VUX.

As described above, the control signal (ready signal) RS can be used to vary the timings of the application of potentials to the block driven in the access mode and the block driven in the standby mode.

This enables a reduced load on the operation of circuits such as the potential generating circuit 8 during the operation of the memory, and enables stable operation of the resistance change memory.

In consequence, according to the resistance change memory in the third embodiment, its operation characteristics can be improved.

(D) Modifications

Modifications of the resistance change memory according to the first to third embodiments are described with reference to FIGS. 15 and 18.

FIG. 15 shows a modification of the circuit configuration of a memory cell array 1.

In the resistance change memory according to the first to third embodiments, a voltage (potential difference) in a forward bias direction has only to be applied to a diode to which a selected cell is connected during the operation performed on the selected block, and a voltage in a reverse bias direction has only to be applied to a diode to which an unselected cell is connected. Therefore, a cell unit 10' including a resistance change storage element 11 and a non-ohmic element 15 may have an internal configuration shown in FIG. 15. As shown in FIG. 15, one end of the resistance change storage element 11 is connected to a word line $WL_j$. The other end of the resistance change storage element 11 is connected to one end (cathode) of the diode 15. The other end (anode) of the diode 15 is connected to a bit line $BL_i$.

Even if the resistance change storage element 11 and the diode 15 are connected to bit line $BL_i$ and word line $WL_j$ as shown in FIG. 15, a potential can be applied to the bit line and the word line as shown in FIGS. 7A and 7B or FIGS. 10A to 10C to drive the resistance change storage element 11. Thus, the operation of the resistance change memory described in the first to third embodiments can be performed.

The internal configuration of the memory cell array 1 is not limited to the configuration shown in FIG. 3 or 15. As long as the operation similar to the operation of the memory described in the first to third embodiments can be performed, the connection of the resistance change storage element and the diode to the bit line and the word line may be properly changed. It is apparent that the relation of the potentials applied to the bit lines and the word lines in the selected block and the unselected blocks is changed accordingly to suit to the internal configuration of the memory cell array 1.

FIG. 16 shows a modification of the blocks set in the memory cell array 1 of the resistance change memory. For example, a region provided in the memory cell array 1 may be divided not only in an x-y direction but also in a z-direction.

In the example shown in FIG. 16, a plurality of regions (hereinafter referred to as sub-blocks sbk) are further set in one block BK. In the configuration of the memory cell array 1 shown in FIG. 16, potentials shown in FIGS. 7A and 7B or FIGS. 10A to 10C may be applied to the predetermined sub-blocks in the selected block and the unselected block (next selected block) in accordance with the operation modes of the block BK and the sub-block sbk.

Thus, the three-dimensionally divided regions of the memory cell array 1 serve as control units, and potentials are applied to these control units using the configuration and operation described in the first to third embodiments. This enables a further reduction in power consumption.

Instead of a plurality of sub-blocks sbk provided in one block, one block may be one region divided in the x-, y- and z-directions. Otherwise, one block may be a region which is not divided in the y-direction but is divided in the x- and z-directions in the memory cell array 1, or may be a region which is not divided in the x-direction but is divided in the y- and z-directions in the memory cell array 1.

FIG. 17 shows a modification of the structure of the memory cell array 1. If a layer including a bit line 13L, a cell unit (series circuit) 10 and a word line WL serves as one unit in the memory cell array having a three-dimensional structure as shown in FIG. 17, the memory cell array 1 may have a structure in which a plurality of layers are alternately stacked via interlayer insulating films 85. In the memory cell array 1 shown in FIG. 17, the number of the resistance change storage elements 11 connected to one wiring is half that in the structure of the memory cell array shown in FIG. 3. Thus, the memory cell array 1 shown in FIG. 17 enables a reduction in the parasitic capacitance and parasitic resistance of wirings 70, 79, high-speed operation and an improvement in the reliability of operation. For example, one layer including the bit line BL, the cell unit (series circuit) 10 and the word line WL may correspond to one sub-block sbk shown in FIG. 16.

Figure 18:
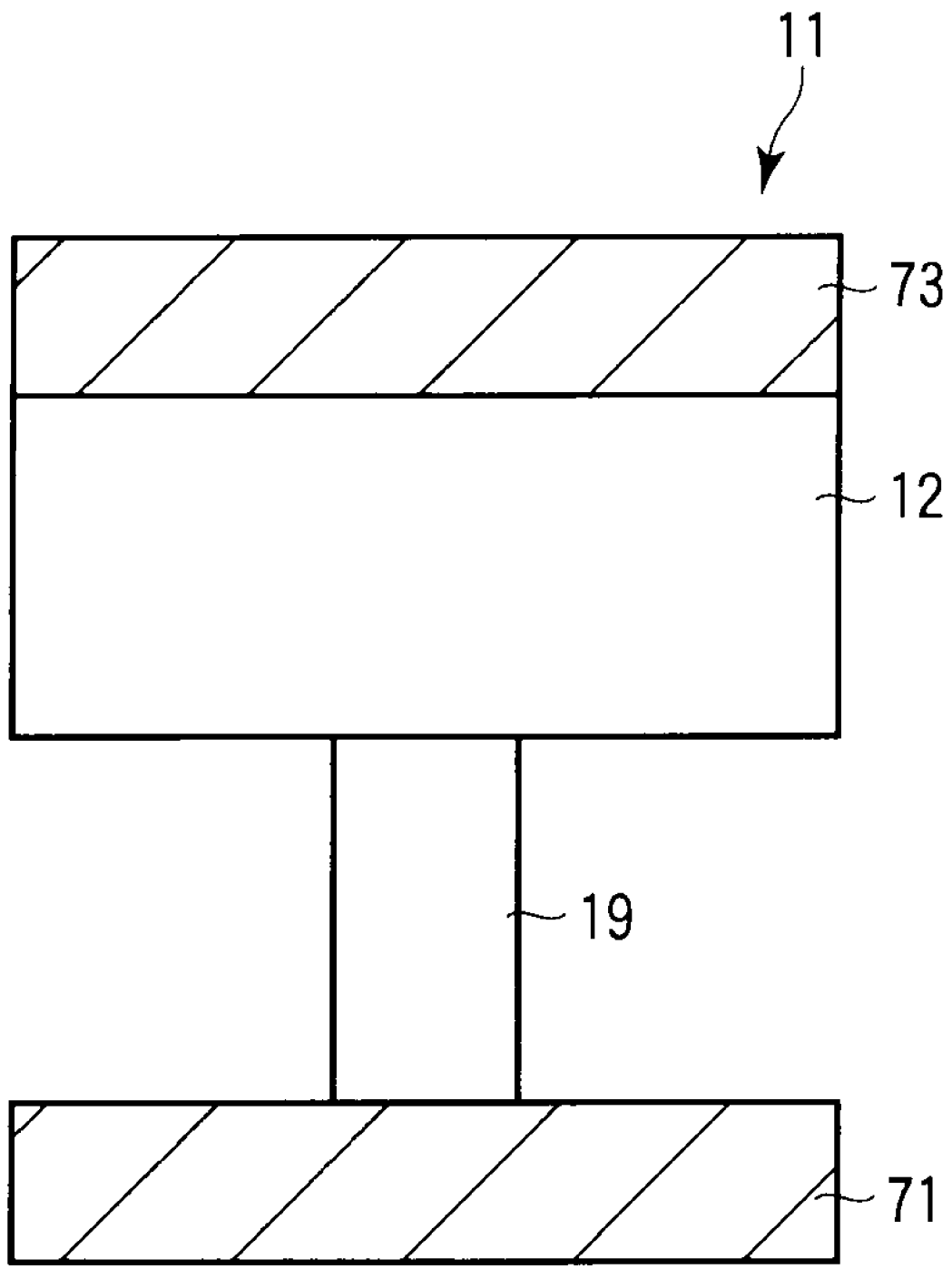
FIG. 18 is a diagram showing a modification of the resistance change storage element.

FIG. 18 shows a modification of the resistance change storage element 11. The resistance change storage element 11 shown in FIG. 18 is used in, for example, a PCRAM. In the PCRAM, the resistance change storage element 11 has a heater layer 19 in addition to a storage layer 12 and two electrodes 71, 73. In the write operation of the PCRAM, a potential difference is made between the bit line and the word line to pass a current through the resistance change storage element 11. Joule heat generated by this current may be used to change the resistance state of the resistance change storage element 11.

In the PCRAM, the storage layer 12 is made of a phase change material, and is set to a crystalline or noncrystalline state depending on applied heat. The material of the storage layer 12 includes a chalcogen compound (chalcogenide) such as Ge—Sb—Te, In—Sb—Te, Ag—In—Sb—Te or Ge—Sn—Te. These materials are preferable in ensuring high-speed switching characteristics, repeated recording stability and high reliability.

The heater layer 19 is in contact with the bottom surface of the storage layer 12, and is provided between the storage layer 12 and the lower electrode 71. The area of contact between the storage layer 12 and the heater layer 19 is preferably smaller than the area of the bottom surface of the storage layer 12. The purpose is to decrease a write current or voltage by reducing the contact part between the heater layer 19 and the storage layer 12 to reduce a heated part. The heater layer 19 is made of a conducting material, and is preferably made of, for example, a material selected from the group consisting of TiN, TiAlN, TiBN, TiSiN, TaN, TaAlN, TaBN, TaSiN, WN, WAlN, WBN, WSiN, ZrN, ZrAlN, ZrBN, ZrSiN, MoN, Al, Al—Cu, Al—Cu—Si, WSi, Ti, Ti—W and Cu. Moreover, the heater layer 19 may be made of the same material as the lower electrode 71 described later.

The area of the lower electrode 71 is greater than the area of the heater layer 19. The upper electrode 73 has, for example, the same planar shape as the storage layer 12. The material of the lower electrode 71 and the upper electrode 73 includes a high melting point metal such as tantalum (Ta), molybdenum (Mo) or tungsten (W).

The heating temperature and heating time are changed by controlling the magnitude and pulse width of a pulse current supplied to the storage layer 12. In accordance with the change in the heating temperature and heating time, the storage layer 12 changes to the crystalline or noncrystalline state. Specifically, during a write, a voltage or current is applied across the lower electrode 71 and the upper electrode 73, and a current is passed to the lower electrode 71 from the upper electrode 73 via the storage layer 12 and the heater layer 19. If the storage layer 12 is heated to nearly its melting point, the storage layer 12 changes to a noncrystalline phase (high-resistive phase), and the storage layer 12 remains in the noncrystalline state even when the application of the voltage or supply of current is stopped.

On the other hand, a voltage or current is applied across the lower electrode 71 and the upper electrode 73, and the storage layer 12 is heated to nearly a temperature suitable for crystallization. Then, the storage layer 12 changes to a crystalline phase (low-resistive phase), and remains in the crystalline state even when the application of the voltage or supply of current is stopped.

When the storage layer 12 is changed to the crystalline phase, the set current of the current pulse applied to the storage layer 12 is lower and the set width of the current pulse is greater than, for example, when the storage layer 12 is changed to the noncrystalline state.

Thus, a voltage or current is applied across the lower electrode 71 and the upper electrode 73 to heat the storage layer 12, such that the resistance of the storage layer 12 is changed.

Whether the storage layer 12 is in the crystalline phase or the noncrystalline phase is known by applying, across the lower electrode 71 and the upper electrode 73, such a low voltage or low current as not to cause the storage layer 12 to be crystalline or noncrystalline and reading the fluctuation of the voltage or current between the lower electrode 71 and the upper electrode 73. Thus, the low-resistance state and the high-resistance state are matched with binary 0 and binary 1, respectively, such that one-bit data can be read from the resistance change storage element 11.

When the modifications shown in FIGS. 15 to 18 are used for the resistance change memory described in the first to third embodiments, the operation substantially similar to that described in the first to third embodiments can be performed.

In consequence, according to the modifications of the embodiments shown in FIGS. 15 to 18, operation characteristics of the resistance change memory can be improved as in the first to third embodiments.

[Addition]

In the resistance change memory according to the first to third embodiments, the block BK has been described as the control unit for the operation of the memory by way of example. In the mean time, there is a resistance change memory that uses a unit called a MAT, sector or memory layer as a control unit. In this memory, a potential is applied to unselected control units simultaneously with the application of a potential to a selected control unit. As a result, it is obvious that this memory has advantages similar to those in the first to third embodiments.

Although the cross-point memory cell array has been described by way of example in the embodiments, the embodiments are not limited thereto. For example, a memory cell array may include memory cells having a structure (one-transistor+one-cell structure) in which a resistance change storage element and current paths of a field effect transistor are connected in series between two bit lines. Alternatively, a memory cell array may include memory cells having a structure (two-transistor+one-cell structure) in which two field effect transistors are connected to one resistance change element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change memory comprising: a memory cell array in which a plurality of blocks are provided; a plurality of resistance change storage elements which are provided in the plurality of blocks and which store data in accordance with a change in resistance state; a plurality of first wirings along a first direction in the plurality of blocks, each of the first wirings being connected to each of the plurality of resistance change storage elements; a plurality of second wirings along a second direction in the plurality of blocks, each of the second wirings being connected to each of the plurality of resistance change storage elements; and a control circuit which controls the state of a selected block targeted for operation and the state of a plurality of unselected blocks except the selected block among the plurality of blocks, wherein the control circuit respectively applies first and second unselect potentials to the first and second wirings in at least one of the unselected blocks during a period in which the selected block is in operation; wherein the unselected block in which the first and second unselect potentials are respectively applied to the first and second wirings is a next selected block to be targeted for operation after the selected block; wherein during a period in which the control circuit is operating the selected block, the control circuit does not apply the first and second unselect potentials to the first and second wirings in the unselected blocks except the next selected block.

2. The resistance change memory according to claim 1, wherein
the control circuit includes a parameter holder which holds a plurality of parameters indicating operation modes of the blocks.

3. The resistance change memory according to claim 2, wherein
the parameter holder holds
a first parameter corresponding to the operation mode of the selected block,
a second parameter corresponding to the operation mode of a next selected block to be selected after the selected block, and
a third parameter corresponding to the operation mode of an unselected block other than the selected block and the next selected block.

4. The resistance change memory according to claim 1, wherein
the control circuit includes a potential detector which detects potentials of the first and second wirings.

5. The resistance change memory according to claim 4, wherein
after the potential detector detects that the first and second wirings in the selected block have reached first and second select potentials,
the control circuit starts the application of the first and second unselect potentials to the first and second wirings in the unselected block.

6. The resistance change memory according to claim 1, wherein
the plurality of blocks allow the selected block and the unselected blocks to change in a preset order.

7. The resistance change memory according to claim 1, further comprising:
a potential generating circuit which generates a potential to be applied to the first and second wirings in the blocks,
wherein the potential generating circuit
generates a first select potential for a selected first wiring in the selected block,
generates a second select potential for a selected second wiring in the selected block,
generates the first unselect potential for the first wirings in the unselected block, and
generates the second unselect potential for the second wirings in the unselected block.

8. The resistance change memory according to claim 1, wherein
the first and second wirings in the unselected block are charged by the first and second unselect potentials.

9. The resistance change memory according to claim 1, wherein
the plurality of resistance change storage elements are arranged in the memory cell array along the first and second directions, and stacked in the memory cell array along a third direction perpendicular to a plane comprising the first and second directions.

10. The resistance change memory according to claim 1, wherein
the block is a region obtained by dividing the memory cell array along the first and second directions.

11. The resistance change memory according to claim 1, wherein
the block is a region obtained by dividing the memory cell array along the first, second and third directions perpendicular to a plane comprising the first and second directions.

12. A method of controlling a resistance change memory, the method comprising: selecting at least one selected block as a target for operation from among a plurality of blocks in a memory cell array, the plurality of blocks including a plurality of resistance change storage elements, and a plurality of first and second wirings connected to the plurality of resistance change storage elements; applying a select potential to the selected block, and applying an unselect potential to at least one unselected block among a plurality of unselected blocks other than the selected block; and stopping the application of the select potential to the selected block; wherein the unselected block to which the unselect potential is applied is a next selected block to be selected after the selected block; applying no potential to an unselected block except the next selected block while the select potential is being applied to the selected block.

13. The resistance change memory control method according to claim 12, wherein
the order of changing from the unselected block to the selected block in the plurality of blocks is preset.

14. The resistance change memory control method according to claim 12, wherein
the application of the unselect potential to the unselected block is started after a potential of the first and second wirings in the selected block has reached the select potential.

15. The resistance change memory control method according to claim 12, wherein
the first and second wirings in the unselected block are charged by the unselect potential before the unselected block becomes the selected block.

16. The resistance change memory control method according to claim 12, wherein
the plurality of resistance change storage elements are arranged along first and second directions of the memory cell array, and stacked along a third direction perpendicular to a plane comprising the first and second directions, and
the block is a region obtained by dividing the memory cell array along the first and second directions.

* * * * *